United States Patent
Keffeler

(10) Patent No.: US 9,098,233 B2
(45) Date of Patent: Aug. 4, 2015

(54) STORAGE DEVICE CARRIER FOR HIGH DENSITY STORAGE SYSTEM

(71) Applicant: David Michael Keffeler, Niwot, CO (US)

(72) Inventor: David Michael Keffeler, Niwot, CO (US)

(73) Assignee: DOT HILL SYSTEMS CORPORATION, Longmont, CO (US)

( * ) Notice: Subject to any disclaimer, the term of this patent is extended or adjusted under 35 U.S.C. 154(b) by 214 days.

(21) Appl. No.: 13/747,637

(22) Filed: Jan. 23, 2013

(65) Prior Publication Data

US 2014/0204522 A1 Jul. 24, 2014

(51) Int. Cl.
  H05K 7/00 (2006.01)
  G06F 1/16 (2006.01)
  G11B 33/12 (2006.01)
  H05K 5/02 (2006.01)

(52) U.S. Cl.
  CPC ............ *G06F 1/16* (2013.01); *G11B 33/128* (2013.01); *H05K 5/0217* (2013.01); *Y10T 29/49815* (2015.01)

(58) Field of Classification Search
  CPC .................... H05K 7/1417; H05K 9/0039
  USPC .......... 361/679.33, 679.37, 679.39, 679.41, 361/679.32; 312/333, 334.1, 322.1
  See application file for complete search history.

(56) References Cited

U.S. PATENT DOCUMENTS

| | | |
|---|---|---|
| 2,566,064 A | 8/1951 | Kiem |
| 3,348,867 A | 10/1967 | Stubblefield et al. |
| 4,370,007 A | 1/1983 | Fler |
| 4,610,487 A | 9/1986 | Delmege et al. |
| 4,696,582 A | 9/1987 | Kasten |
| 4,730,364 A | 3/1988 | Tat-Kee |
| 5,181,781 A | 1/1993 | Wojcik |
| 5,328,401 A | 7/1994 | DeMars |
| 5,507,571 A | 4/1996 | Hoffman |
| 5,722,750 A | 3/1998 | Chu |
| 6,126,255 A | 10/2000 | Yang |
| 6,182,169 B1 | 1/2001 | Force et al. |
| 6,254,209 B1 | 7/2001 | Parvin |
| 6,435,636 B1 | 8/2002 | MacMillan |
| 6,535,381 B2 | 3/2003 | Jahne et al. |
| 6,535,390 B1 | 3/2003 | Lo |
| 6,600,648 B2 * | 7/2003 | Curlee et al. ............. 361/679.34 |
| 6,611,424 B2 | 8/2003 | Huang |
| 6,661,671 B1 | 12/2003 | Franke et al. |

(Continued)

OTHER PUBLICATIONS

Wikipedia "Thermoplastic polyurethane", downloaded Oct. 18, 2013, from https://en.wikipedia.org/wiki/Thermoplastic_polyurethane.

(Continued)

*Primary Examiner* — Robert J Hoffberg
*Assistant Examiner* — Hung Dang
(74) *Attorney, Agent, or Firm* — Thomas J. Lavan

(57) ABSTRACT

A storage device carrier includes a first member and a second member. The first member includes a side portion and a front portion, perpendicularly coupled to an inside surface of a front end of the first member side portion. The first member includes a first portion of a finger grab. The second member includes a side portion and a latching feature. The latching feature is on an outside surface of a second member side portion. The second member also includes a front portion, perpendicularly coupled to an inside surface of a front end of the second member side portion. The second member includes a second portion of the finger grab.

20 Claims, 27 Drawing Sheets

(56) References Cited

U.S. PATENT DOCUMENTS

| | | | |
|---|---|---|---|
| 6,789,862 B2 | 9/2004 | Shih-Long et al. | |
| 6,824,233 B2 | 11/2004 | Chen et al. | |
| 6,910,557 B2 | 6/2005 | Doornbos et al. | |
| 6,932,511 B2 | 8/2005 | Doornbos et al. | |
| 6,979,065 B2 | 12/2005 | Egger | |
| 6,999,306 B2 | 2/2006 | Walczak et al. | |
| 7,086,708 B2 | 8/2006 | Tseng et al. | |
| 7,251,130 B2 | 7/2007 | Tsai | |
| 7,254,741 B1 | 8/2007 | Sardella et al. | |
| 7,296,116 B2 | 11/2007 | Davis et al. | |
| 7,296,117 B2 | 11/2007 | Davis et al. | |
| 7,349,204 B2 | 3/2008 | Tanaka et al. | |
| 7,359,186 B2 | 4/2008 | Honda et al. | |
| 7,359,189 B2 * | 4/2008 | Chiang et al. | 361/679.33 |
| 7,362,565 B2 | 4/2008 | Imblum | |
| 7,375,923 B2 | 5/2008 | DeCenzo et al. | |
| 7,436,658 B1 | 10/2008 | Haager et al. | |
| 7,474,532 B1 | 1/2009 | Desrosiers et al. | |
| 7,486,526 B1 | 2/2009 | Frangioso et al. | |
| 7,545,639 B2 | 6/2009 | Ridge | |
| 7,583,507 B2 | 9/2009 | Starr et al. | |
| 7,697,278 B2 * | 4/2010 | Peng et al. | 361/679.35 |
| 7,742,308 B1 | 6/2010 | King et al. | |
| 7,864,538 B2 | 1/2011 | Wadsworth et al. | |
| 7,864,539 B2 | 1/2011 | Dunham et al. | |
| 7,948,759 B2 | 5/2011 | Ye | |
| 7,952,883 B2 | 5/2011 | Hidaka | |
| 8,120,922 B2 | 2/2012 | Randall et al. | |
| 8,191,841 B2 | 6/2012 | Jeffery et al. | |
| 8,205,951 B2 | 6/2012 | Boks | |
| 8,496,493 B2 * | 7/2013 | Lin et al. | 439/345 |
| 8,743,549 B2 | 6/2014 | Frink et al. | |
| 8,755,178 B2 * | 6/2014 | Zheng et al. | 361/679.37 |
| 2003/0016587 A1 | 1/2003 | Wilson et al. | |
| 2003/0147220 A1 | 8/2003 | Fairchild | |
| 2004/0017138 A1 | 1/2004 | Mueller et al. | |
| 2005/0182889 A1 | 8/2005 | Davis et al. | |
| 2005/0182898 A1 | 8/2005 | Davis et al. | |
| 2005/0185374 A1 | 8/2005 | Wendel et al. | |
| 2006/0291159 A1 | 12/2006 | Jiang et al. | |
| 2007/0230111 A1 | 10/2007 | Starr et al. | |
| 2007/0247804 A1 | 10/2007 | Li et al. | |
| 2008/0011564 A1 | 1/2008 | Chen et al. | |
| 2008/0073469 A1 | 3/2008 | Mushan et al. | |
| 2008/0304803 A1 | 12/2008 | Krampotich et al. | |
| 2009/0237877 A1 | 9/2009 | Honda et al. | |
| 2010/0172083 A1 | 7/2010 | Randall et al. | |
| 2010/0172087 A1 | 7/2010 | Jeffery et al. | |
| 2011/0032665 A1 * | 2/2011 | Huang et al. | 361/679.01 |
| 2011/0069441 A1 | 3/2011 | Killen et al. | |
| 2011/0188815 A1 | 8/2011 | Blackwell et al. | |
| 2012/0084579 A1 | 4/2012 | Izquierdo et al. | |
| 2012/0127648 A1 | 5/2012 | Randall et al. | |
| 2012/0134086 A1 | 5/2012 | Zhang | |
| 2012/0212909 A1 | 8/2012 | Jeffery et al. | |
| 2013/0050955 A1 | 2/2013 | Shinsato et al. | |
| 2013/0077900 A1 | 3/2013 | Lowe et al. | |
| 2013/0104467 A1 | 5/2013 | Yamao et al. | |
| 2013/0176677 A1 | 7/2013 | Rust et al. | |
| 2013/0230262 A1 | 9/2013 | Park et al. | |
| 2013/0265725 A1 | 10/2013 | Harvilchuck | |
| 2014/0203696 A1 | 7/2014 | Rust | |
| 2014/0204525 A1 | 7/2014 | Pecone | |
| 2014/0204537 A1 | 7/2014 | Rust | |
| 2014/0265784 A1 | 9/2014 | Russell | |
| 2014/0265794 A1 | 9/2014 | Schroeder | |

OTHER PUBLICATIONS

Wikipedia "Shore Durometer", downloaded Oct. 18, 2013, from https://en.wikipedia.org/wiki/Shore_durometer.
International search report for application PCT/US 14/10671, dated May 14, 2014.
International search report for application PCT/US 14/12777, dated May 13, 2014.
International search report for application PCT/US 14/12785, dated May 14, 2014.
Written opinion for application PCT/US 14/10671, dated May 14, 2014.
Written opinion for application PCT/US 14/12777, dated May 13, 2014.
Written opinion for application PCT/US 14/12785, dated May 14, 2014.
International search report for application PCT/US 14/23936, dated Sep. 1, 2014.
International search report for application PCT/US 14/23951, dated Sep. 8, 2014.
Written opinion for application PCT/US 14/23936, dated Sep. 1, 2014.
Written opinion for application PCT/US 14/23951, dated Sep. 8, 2014.
Official Action for U.S. Appl. No. 13/747,623, mailed Sep. 24, 2014.
Official Action for U.S. Appl. No. 13/747,609, mailed Oct. 2, 2014.
ThomasNet: "Interlock system allows only 1 drawer to open at a time", http://news.thomasnet.com/fullstory/Interlock-System-allows-only-1-drawer-to-open-at-a-time, dated Apr. 5, 2011.
Official Action for U.S. Appl. No. 13/747,609, mailed May 4, 2015.
Notice of Allowance for U.S. Appl. No. 13/747,623, mailed Feb. 25, 2015.
Official Action for U.S. Appl. No. 13/747,585, mailed Apr. 21, 2015.
Official Action for U.S. Appl. No. 14/100,043, mailed Apr. 10, 2015.
Official Action for U.S. Appl. No. 14/100,053, mailed Jun. 8, 2015.

* cited by examiner

Fig. 1 Data storage network
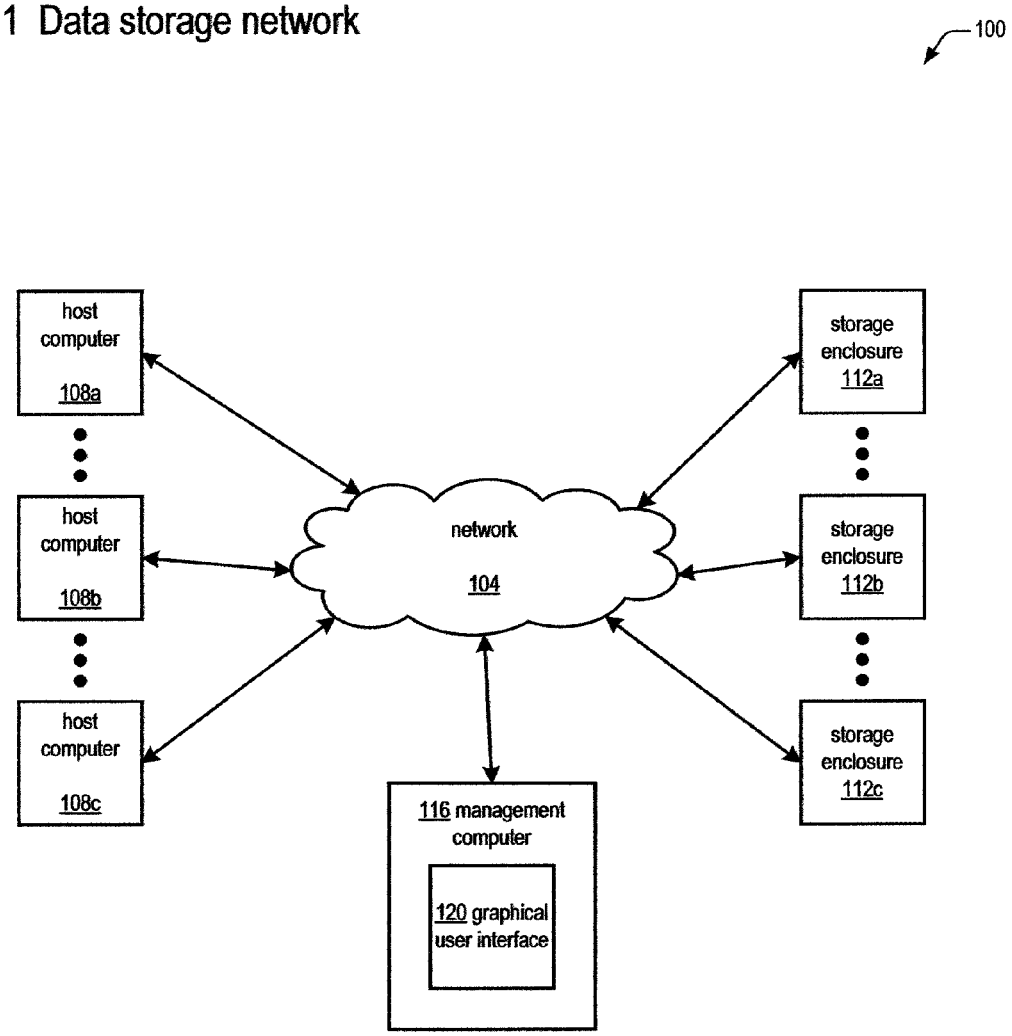

Fig. 2a Host-based data storage system
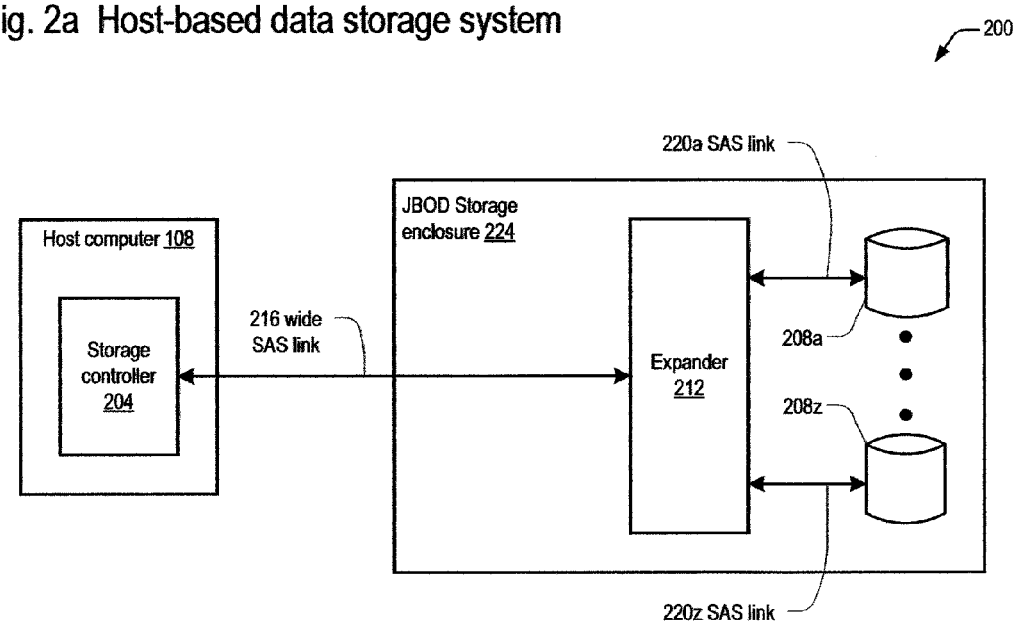
Fig. 2b Non host-based data storage system
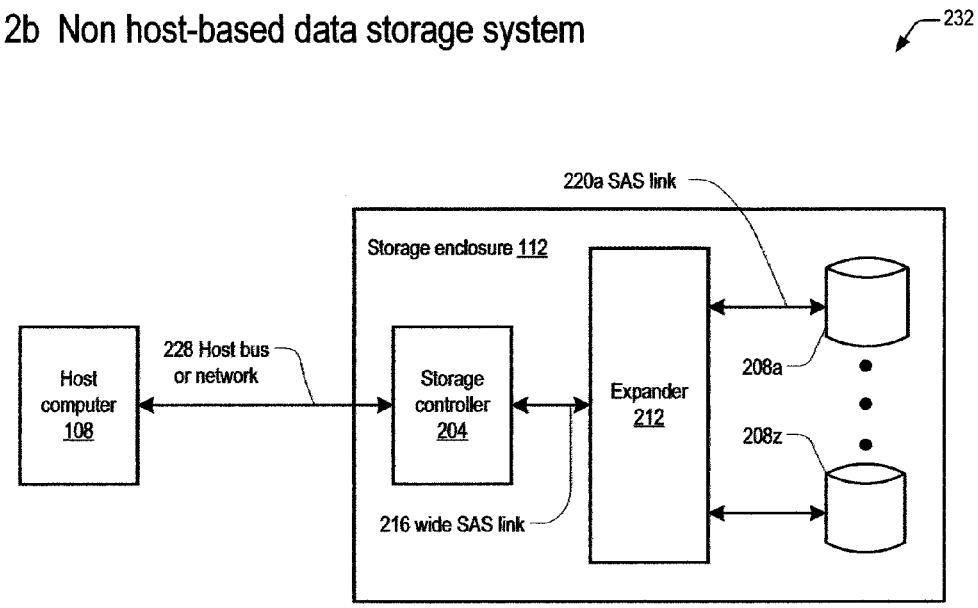

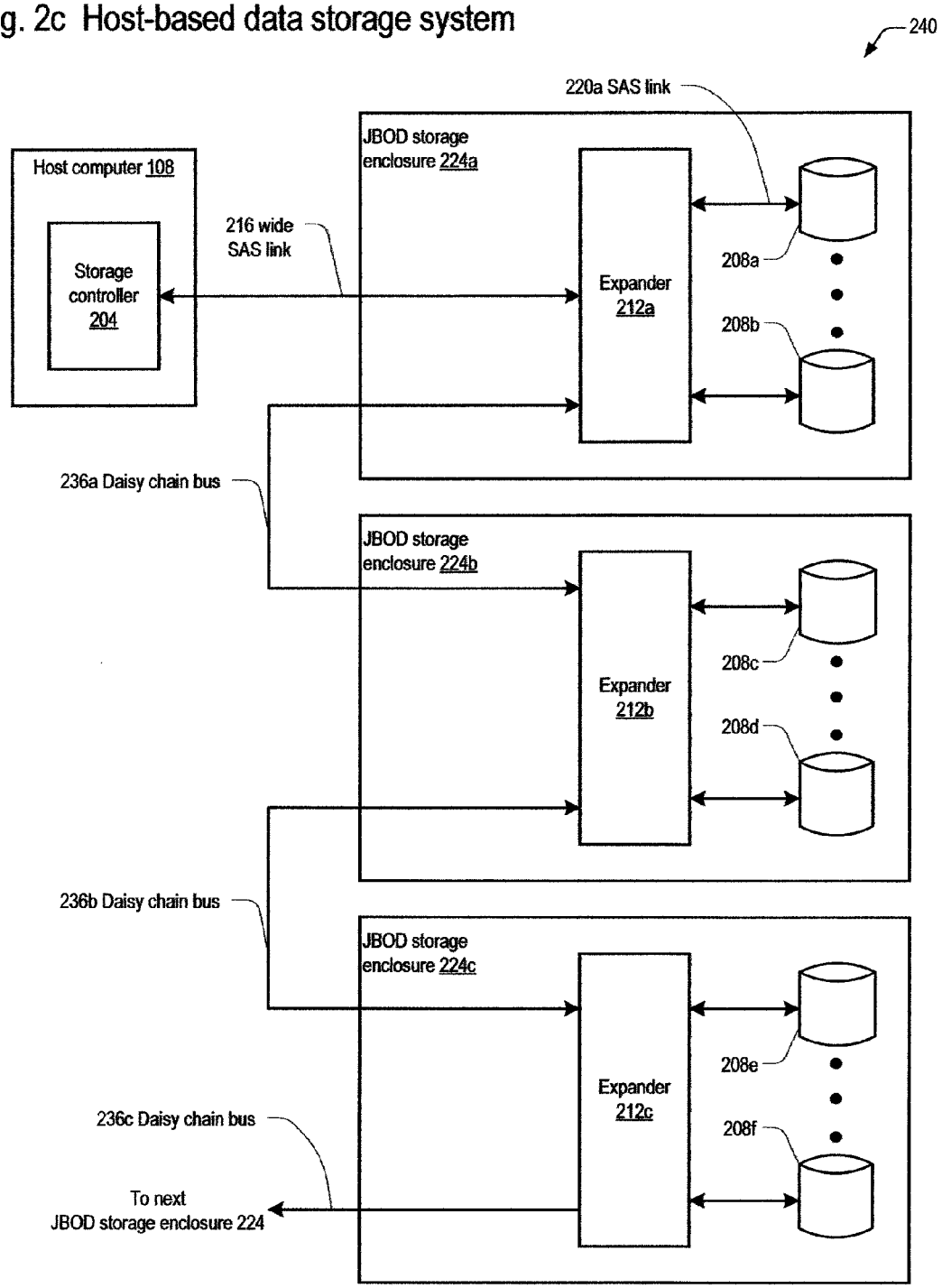
Fig. 2c Host-based data storage system

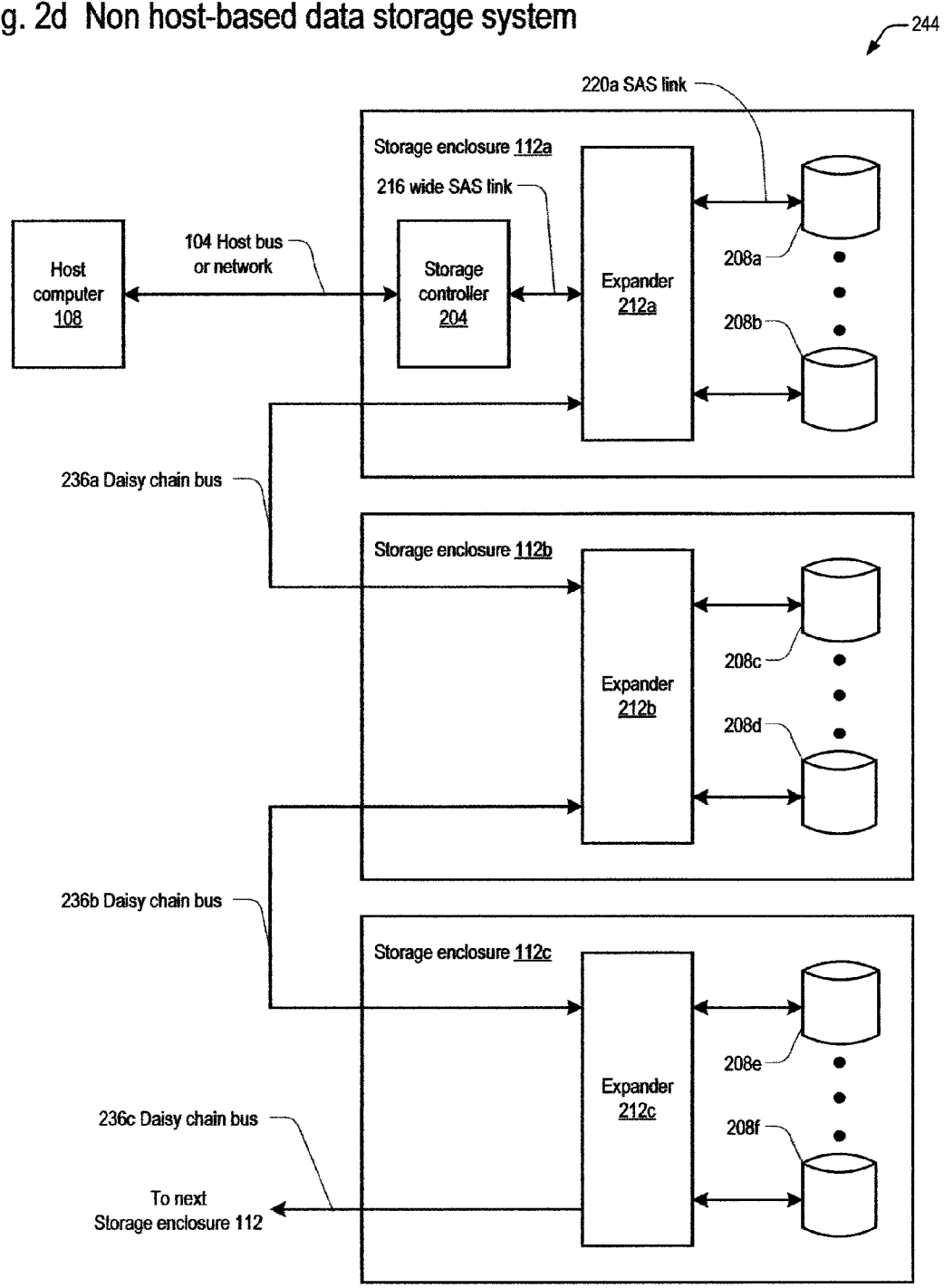
Fig. 2d Non host-based data storage system

Fig. 3a Storage enclosure
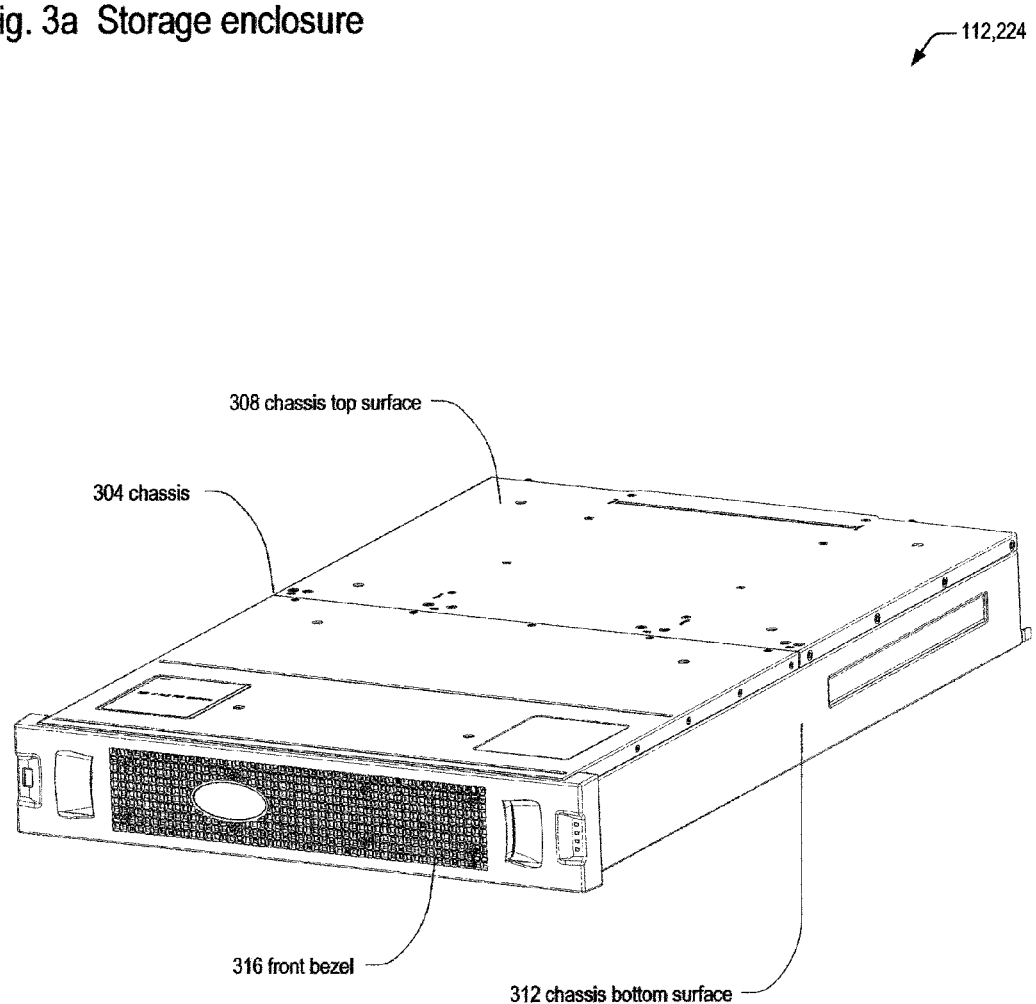

Fig. 3b  Storage enclosure chassis
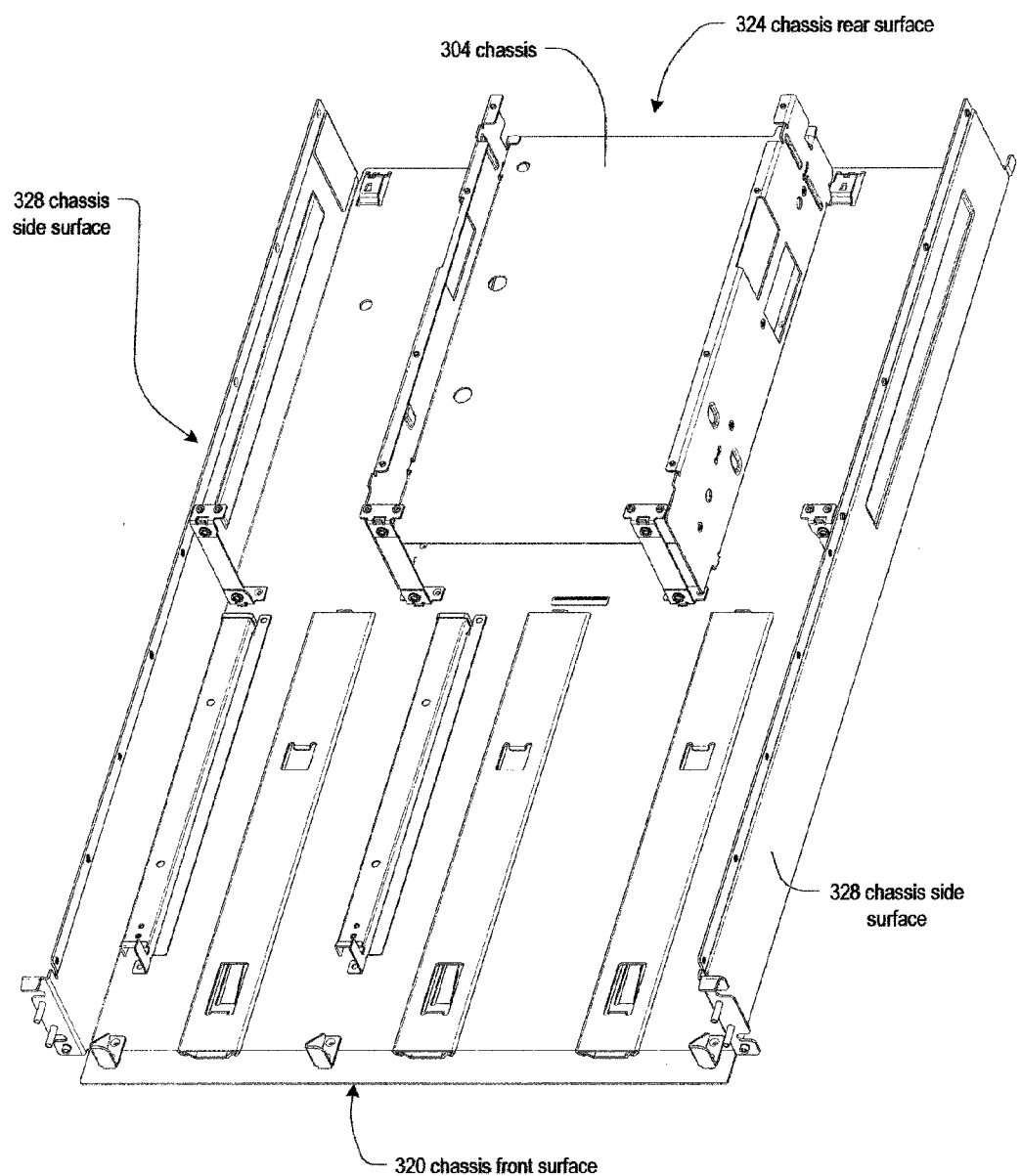

Fig. 3c Chassis components of storage enclosure without drawers
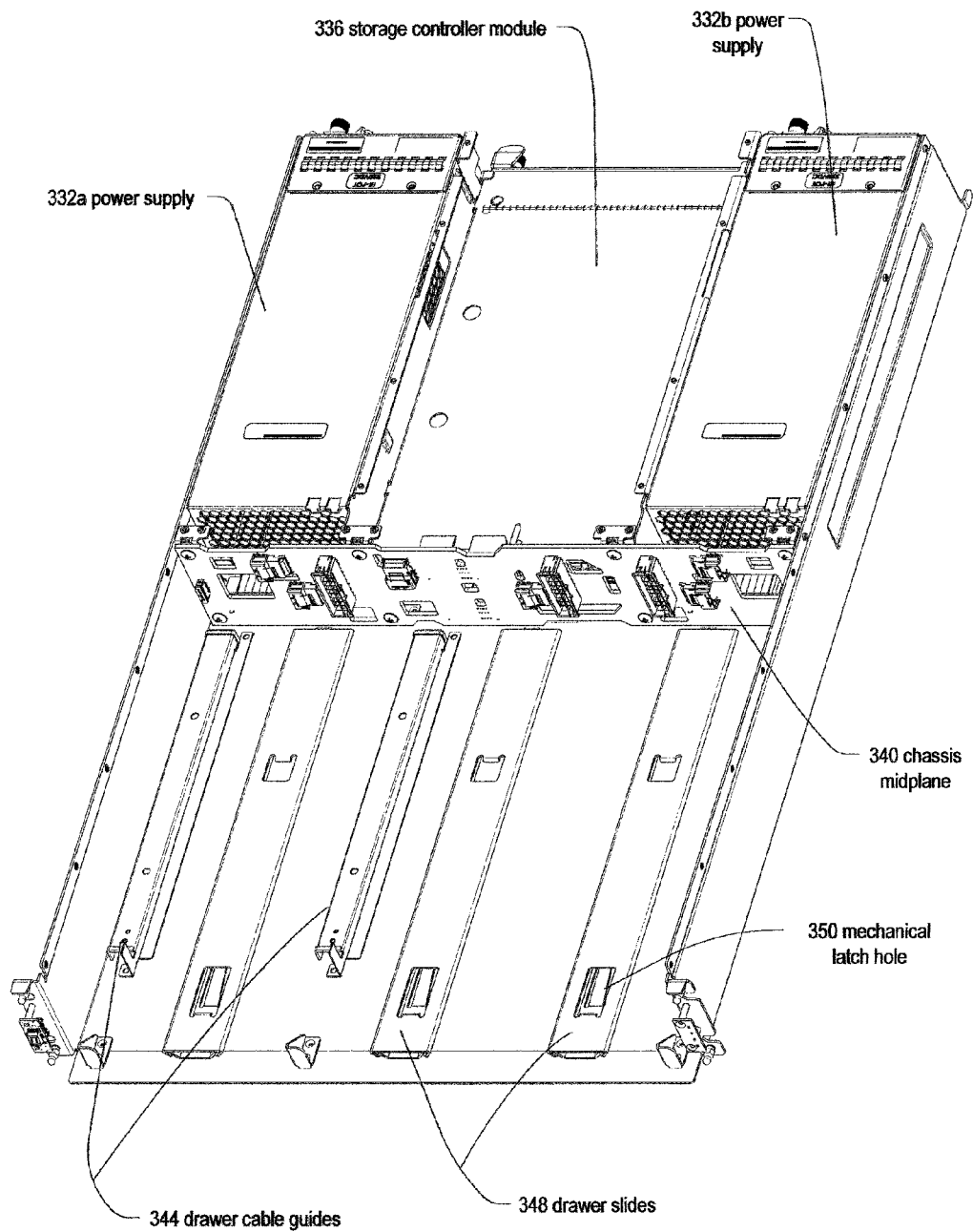

Fig. 3d Chassis components including drawers
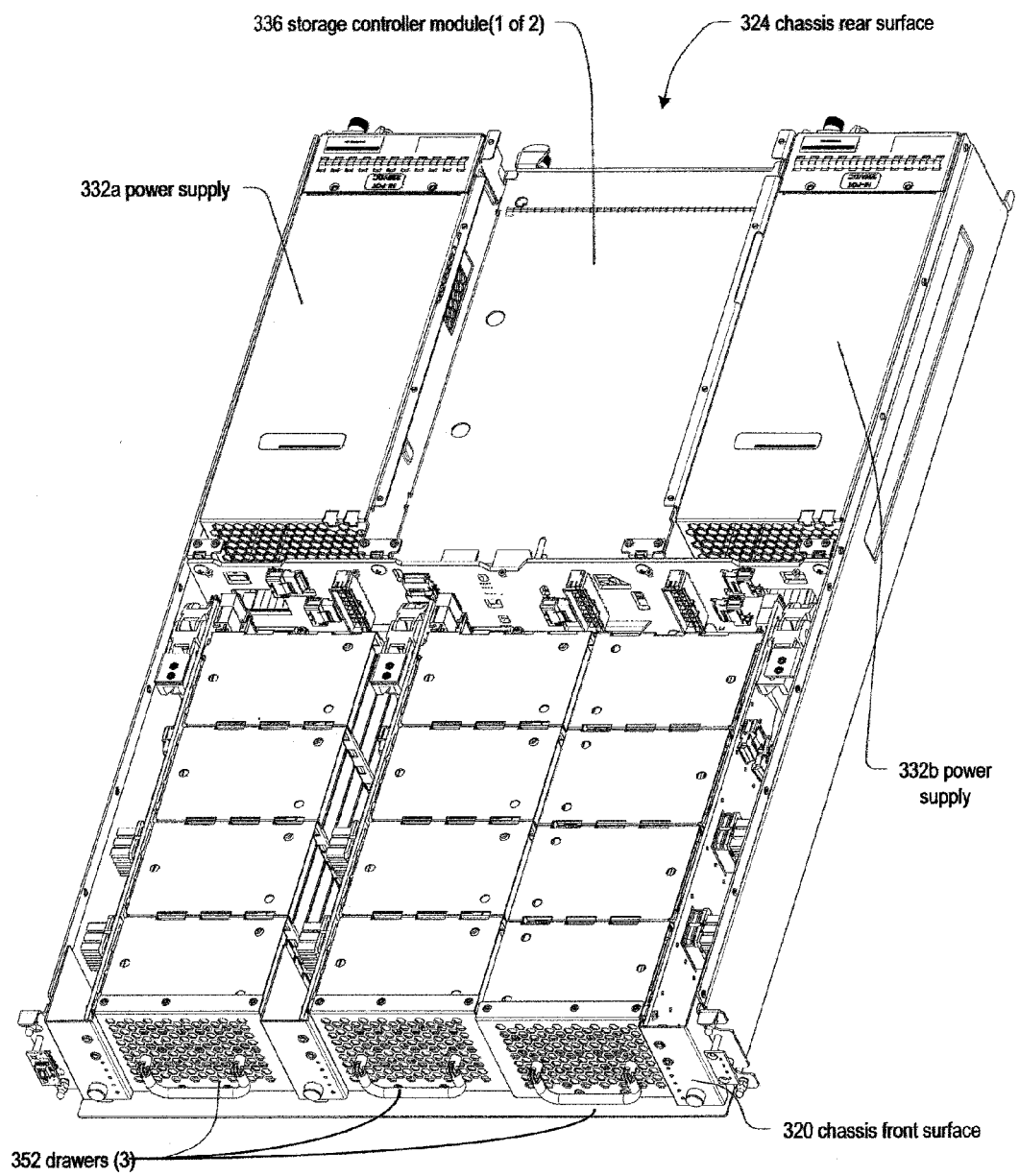

Fig. 3e  Storage enclosure with left drawer extended
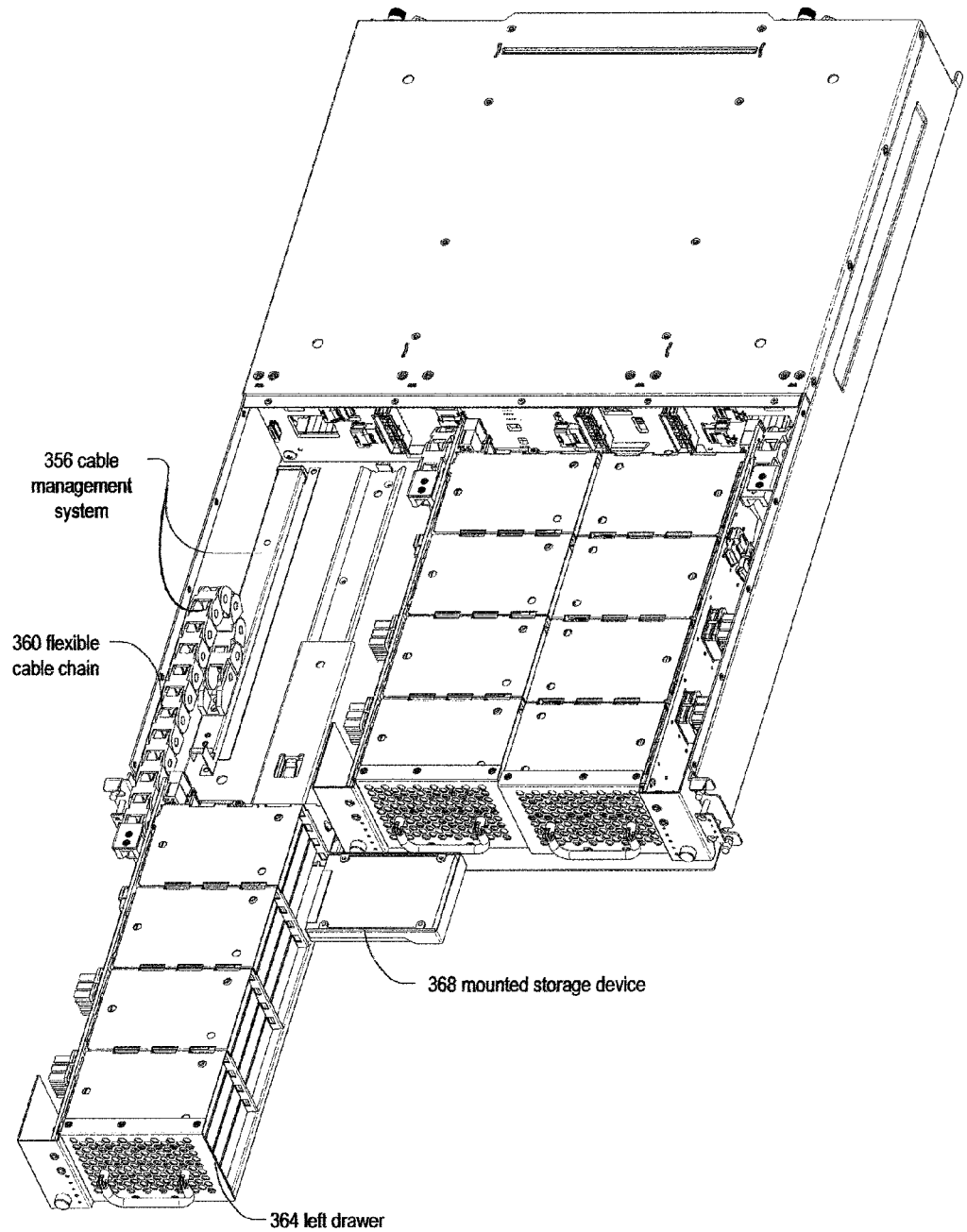

Fig. 3f   Storage enclosure with left drawer extended
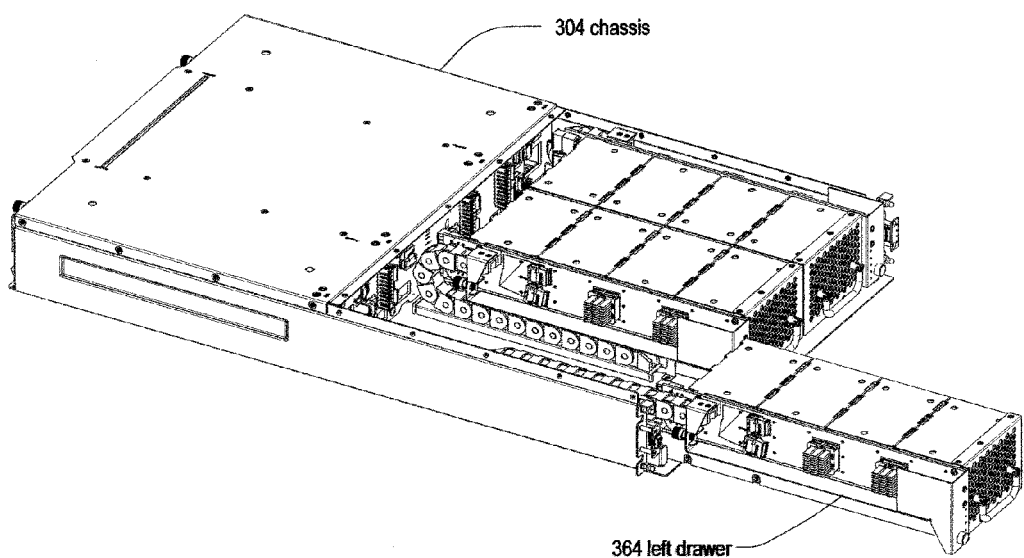
Fig. 3g   Storage enclosure with center drawer extended
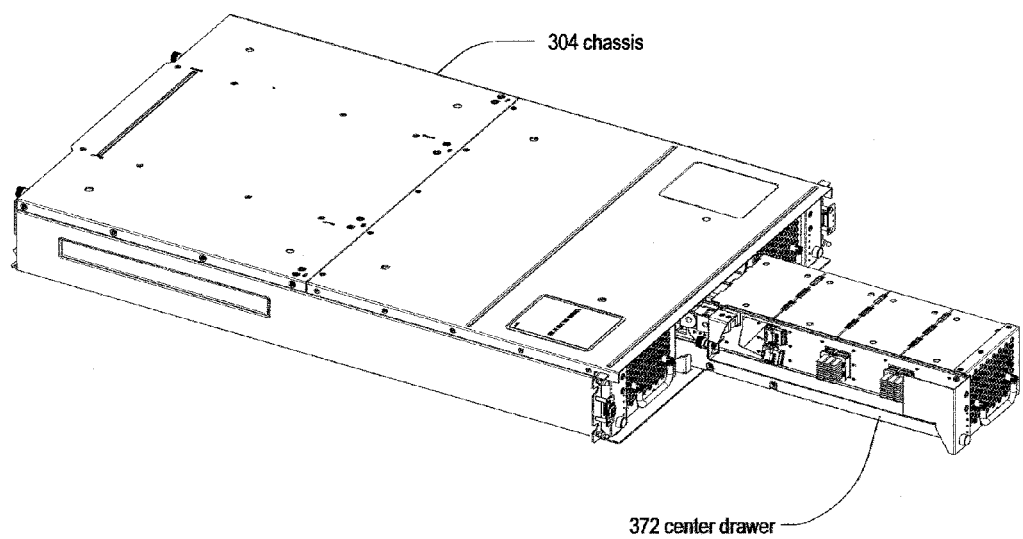

Fig. 3h  Storage enclosure with left drawer extended
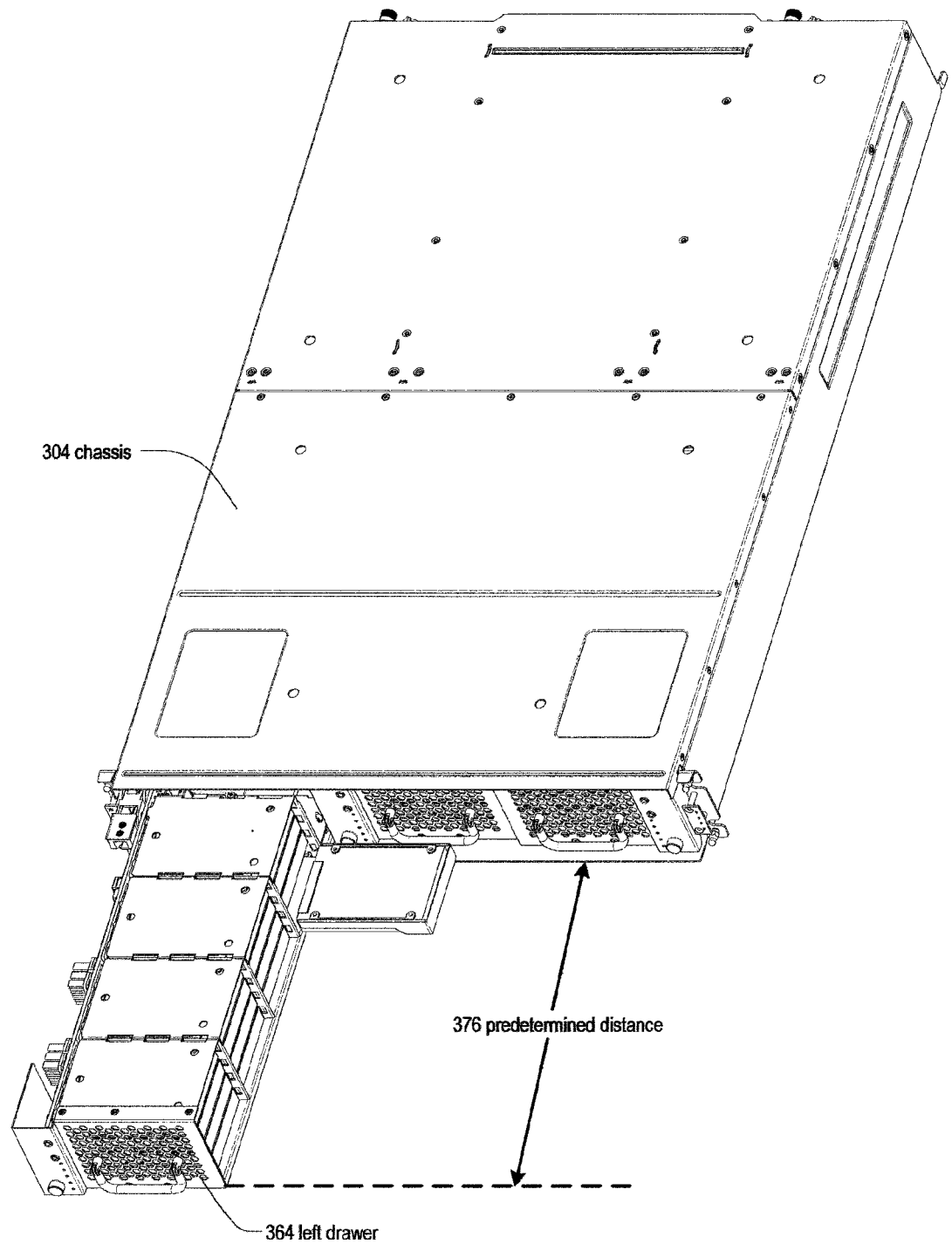

Fig. 3i  Storage enclosure with right drawer extended
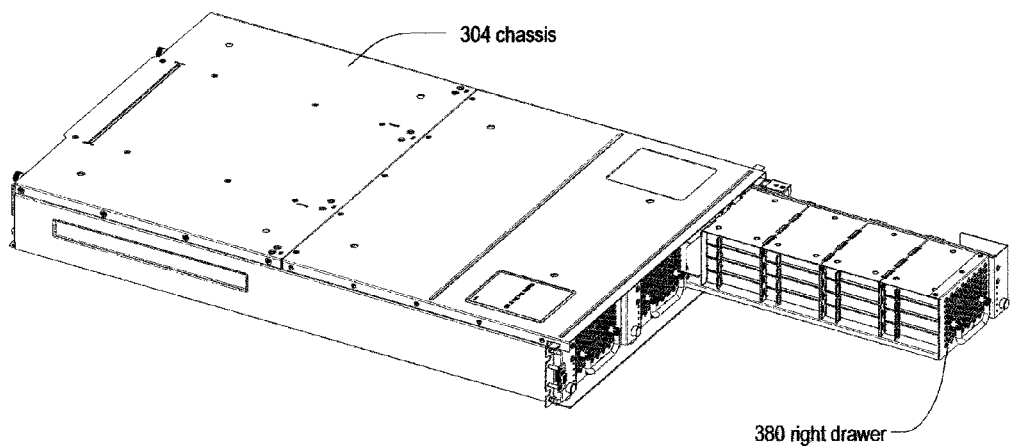
Fig. 3j  Right drawer configuration
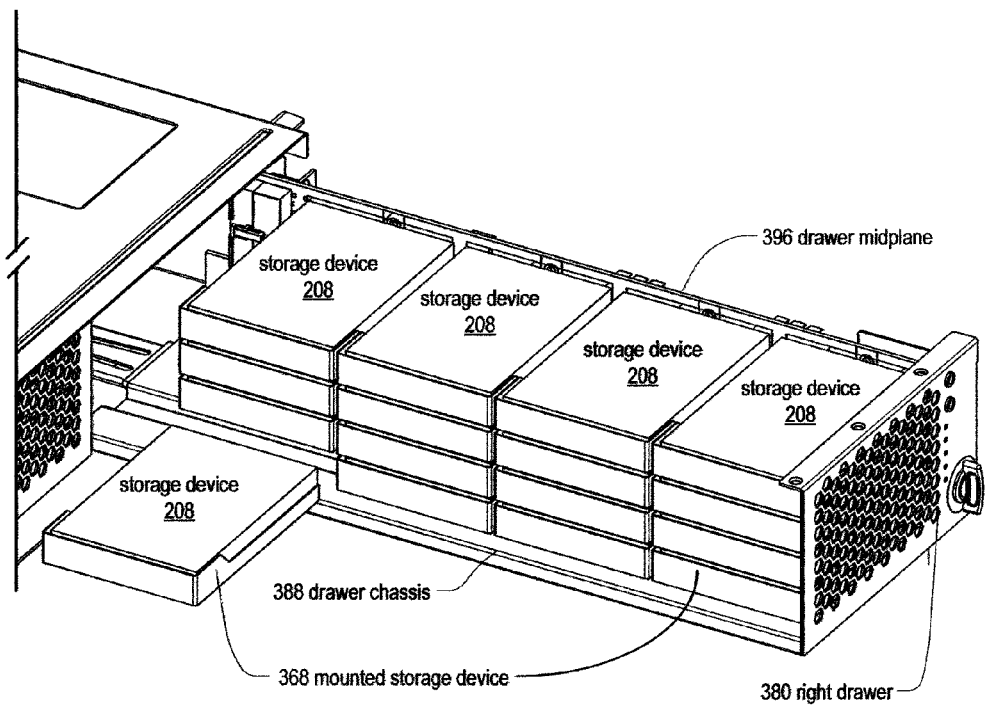

Fig. 4a  Left and right drawer configurations
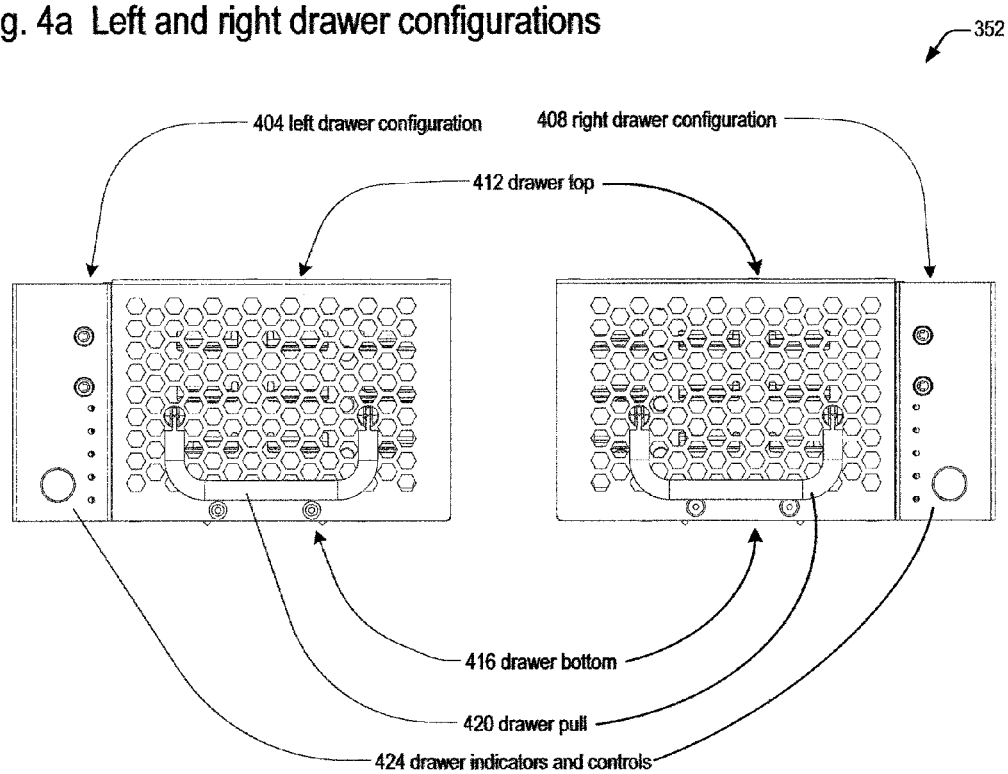
Fig. 4b  Drawers and power supply modules
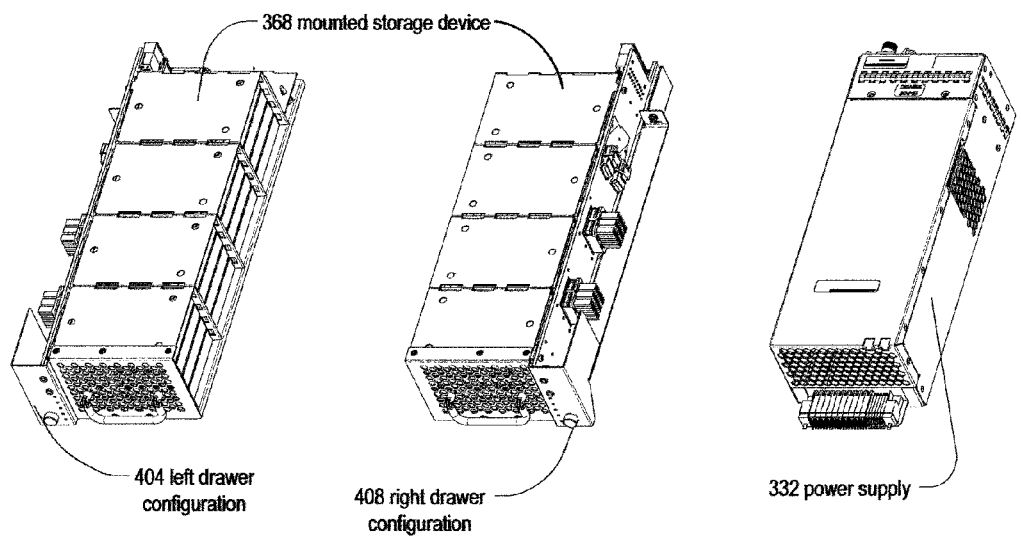

Fig. 4c  Drawer storage device mounting configuration
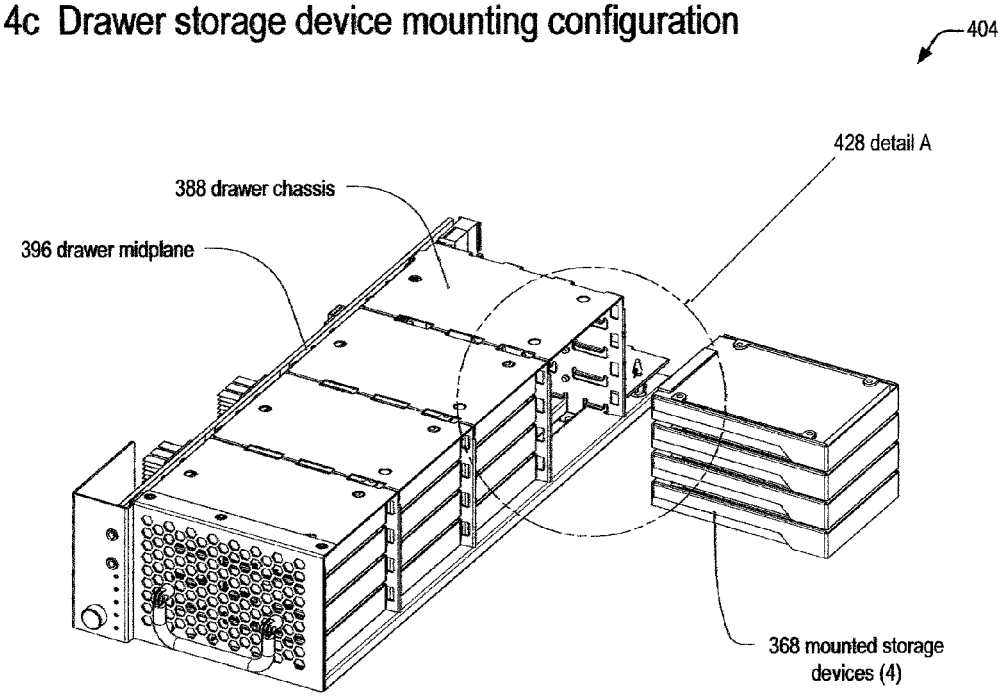
Fig. 4d  Detail A for drawer storage device mounting configuration
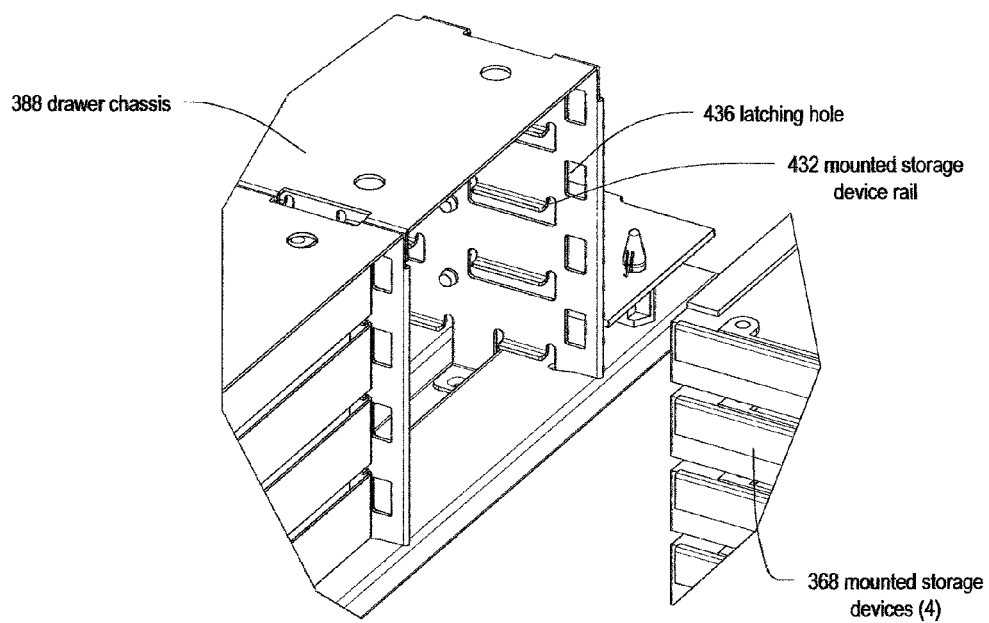

Fig. 4e Storage controller module
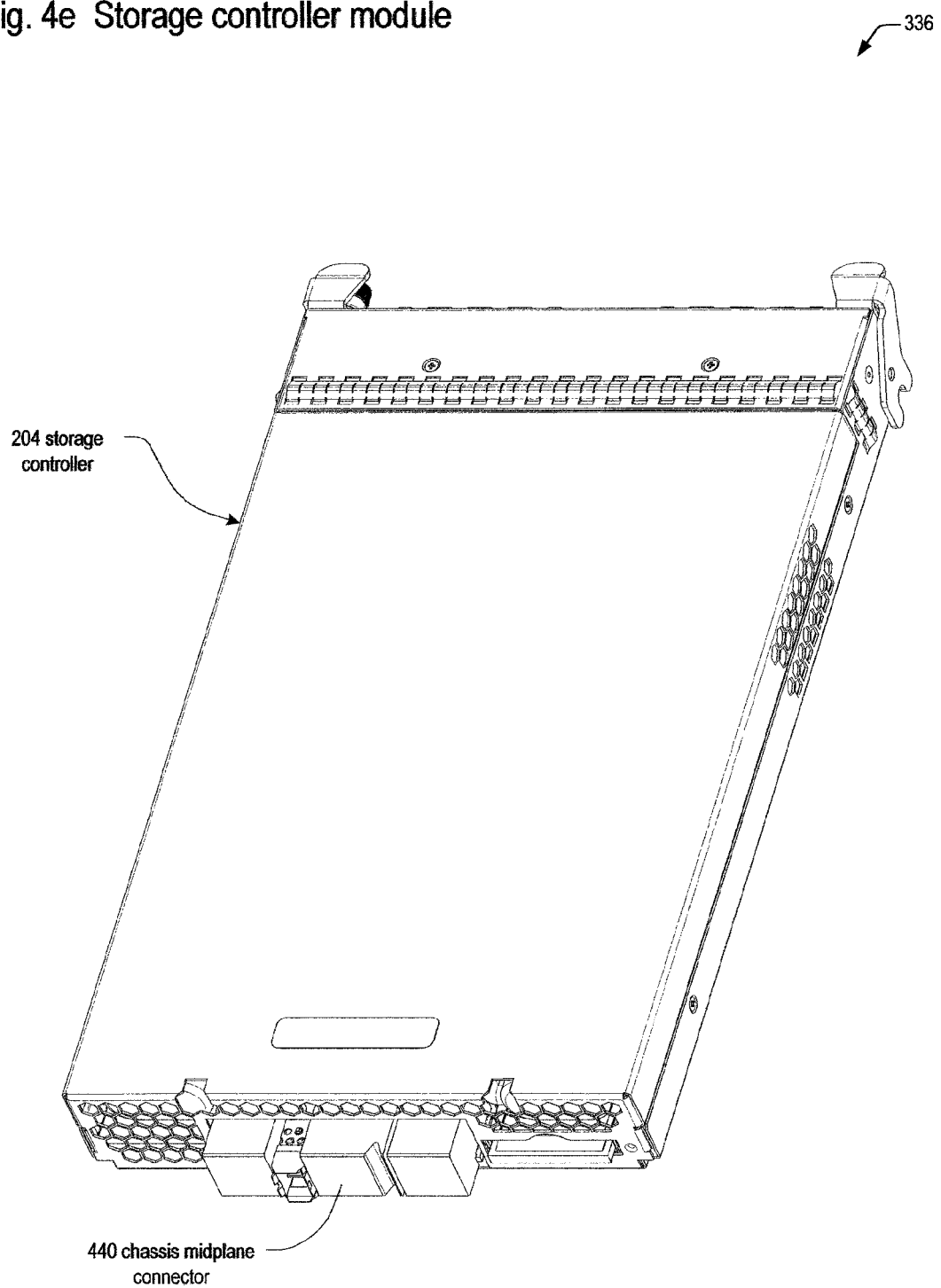

Fig. 4f Chassis and drawer midplanes
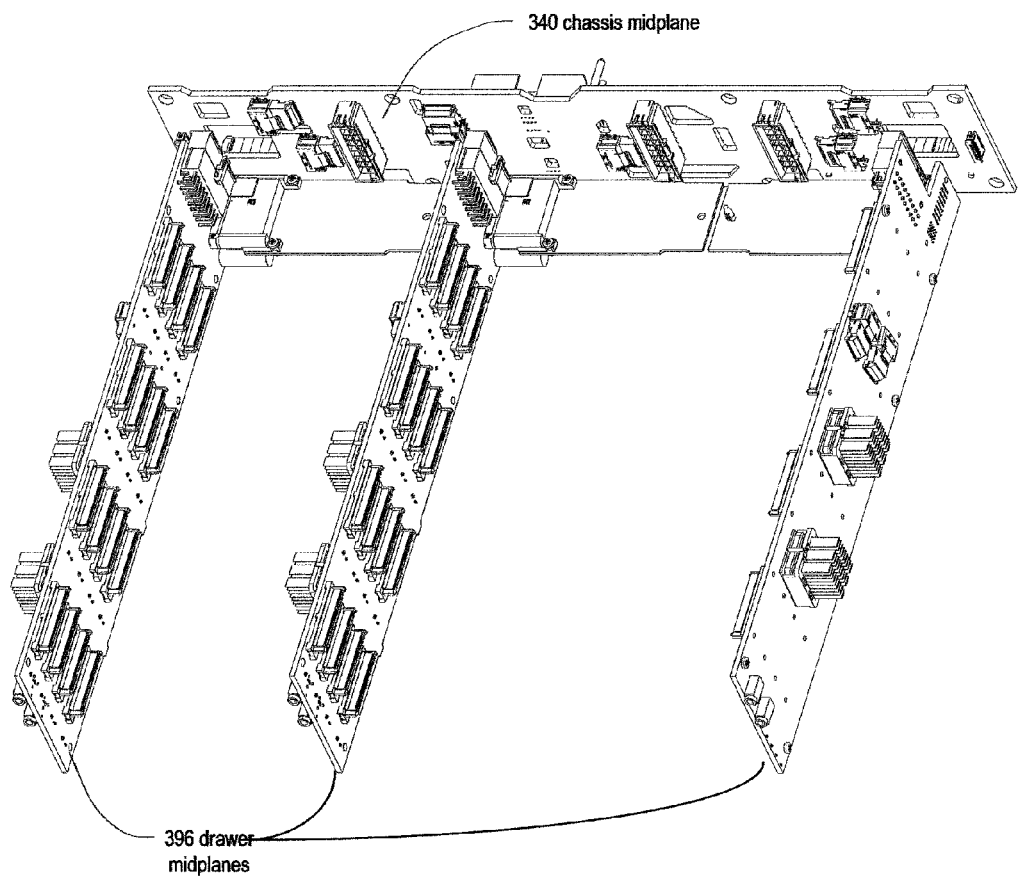
Fig. 4g Chassis cutaway side view
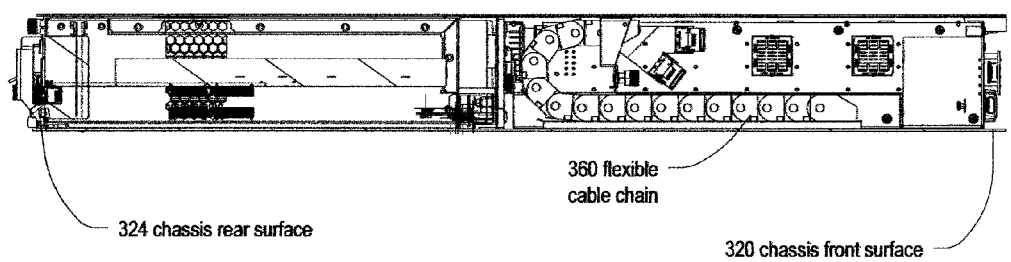

Fig. 5a Storage enclosure in rack, with no drawers extended
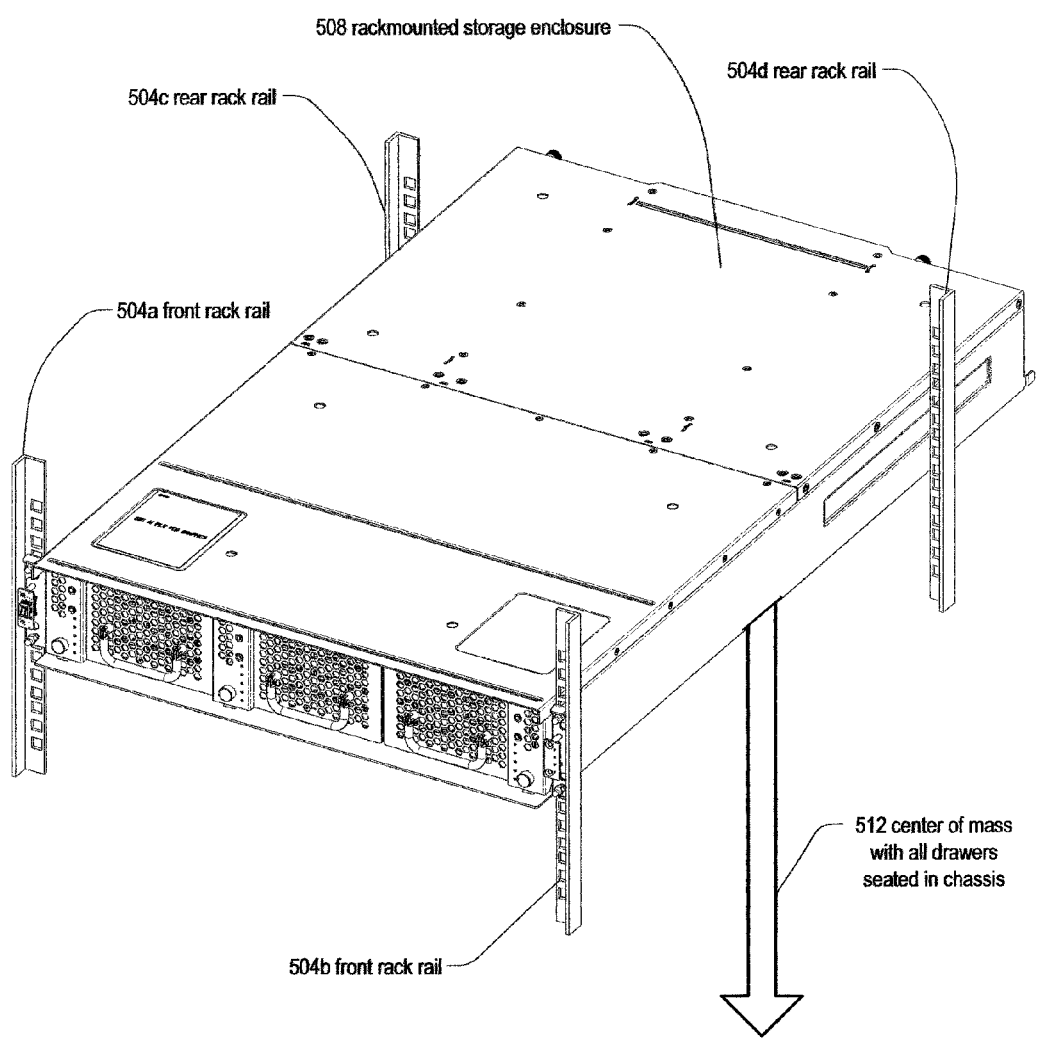

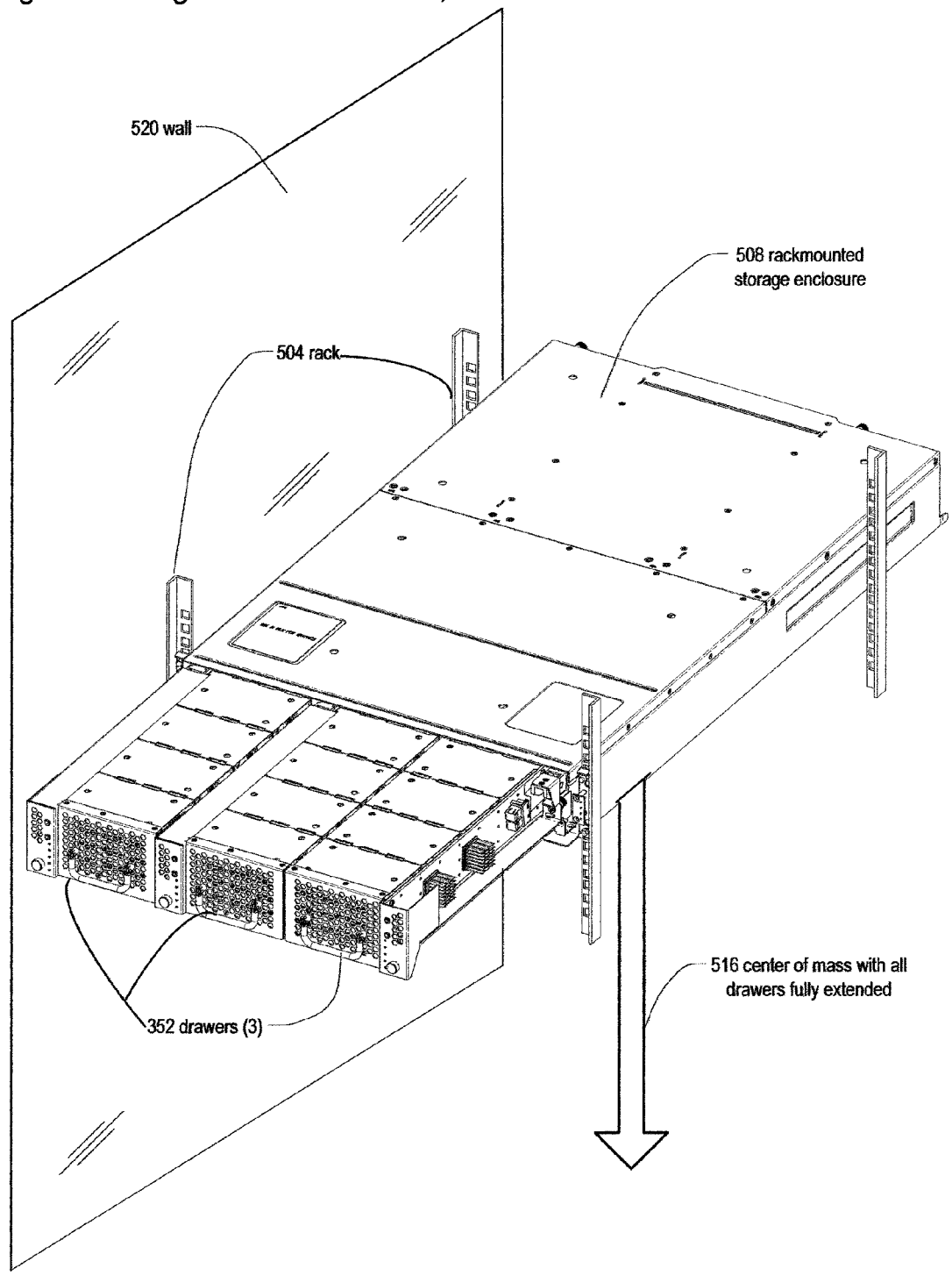
Fig. 5b Storage enclosure in rack, with all drawers extended

Fig. 6 Storage enclosure block diagram
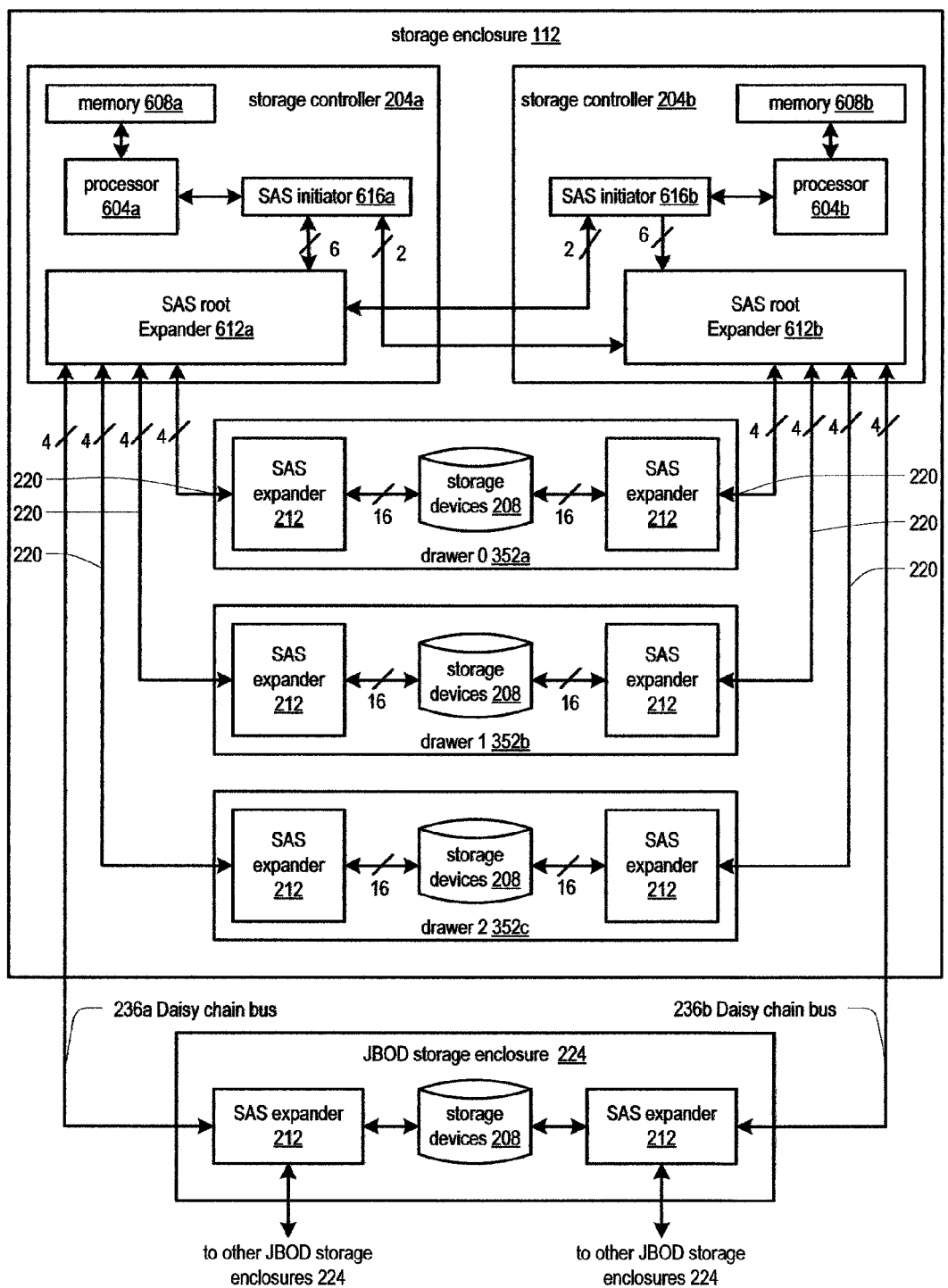

Fig. 7 Drawer midplane block diagram
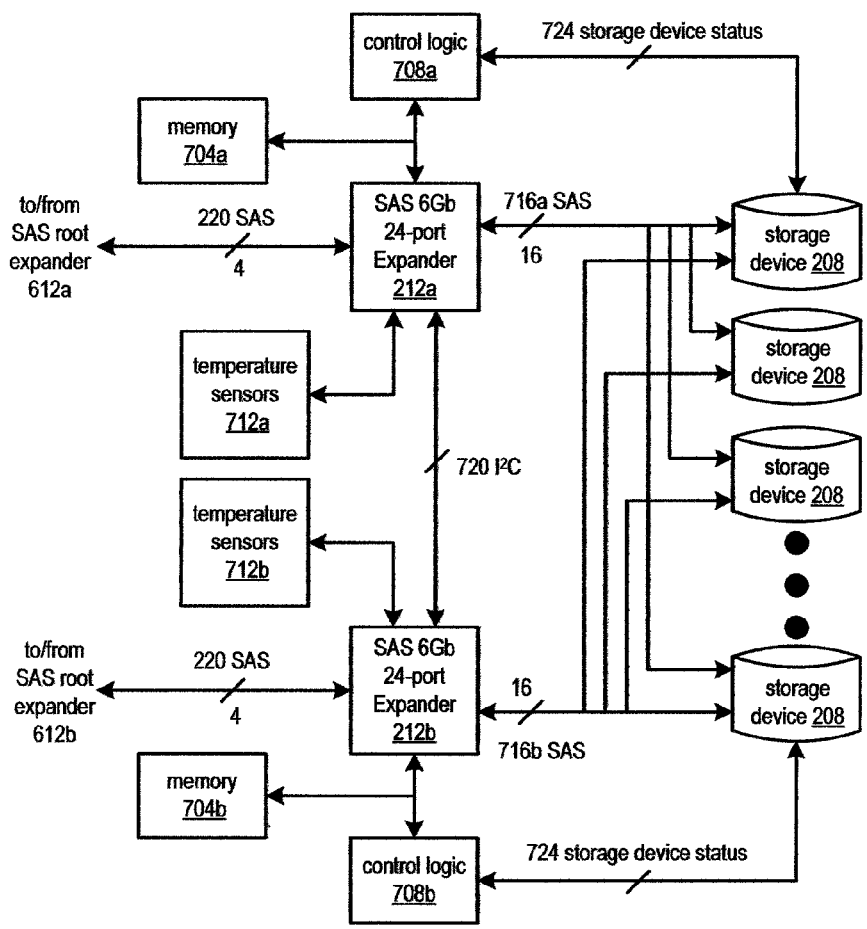

Fig. 8 Drawer interconnection to storage enclosure block diagram
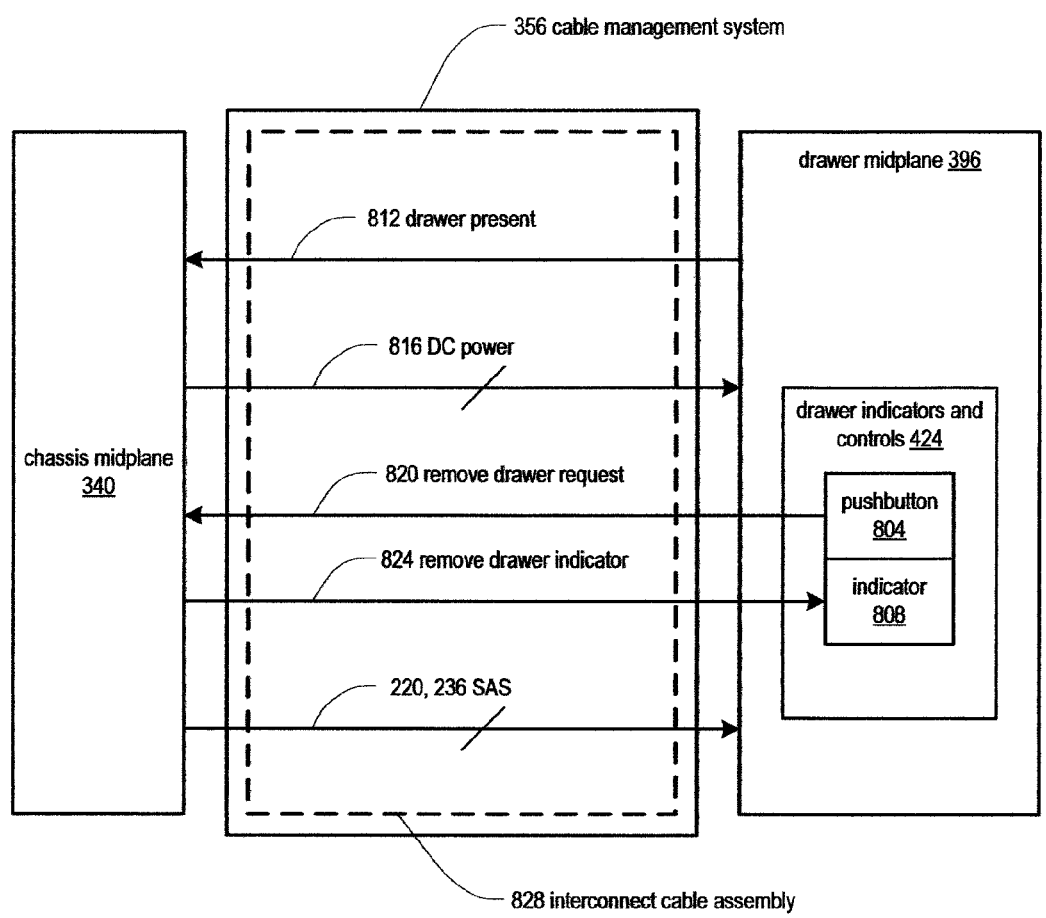

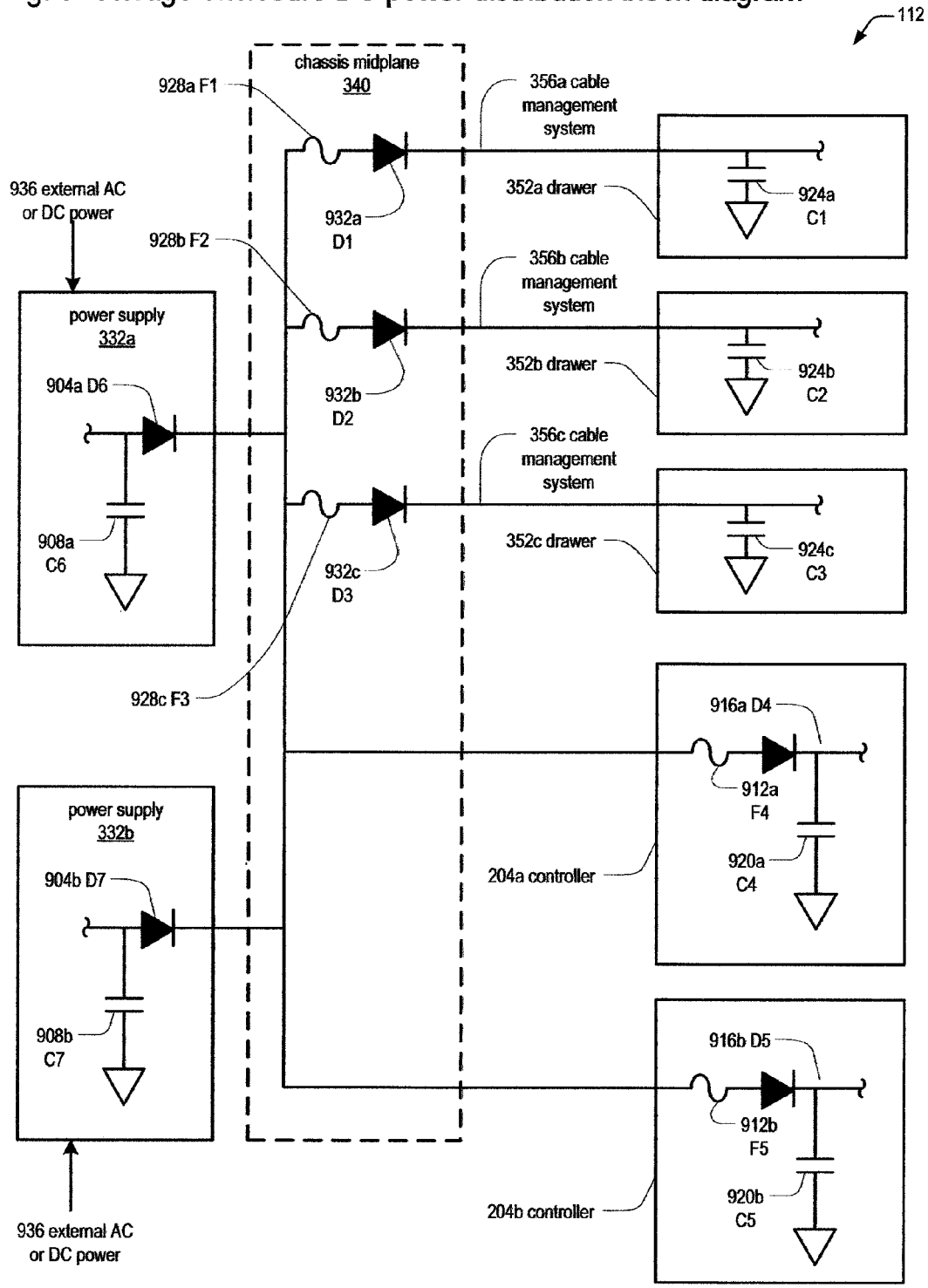
Fig. 9 Storage enclosure DC power distribution block diagram

Fig. 10a Drawer installation process
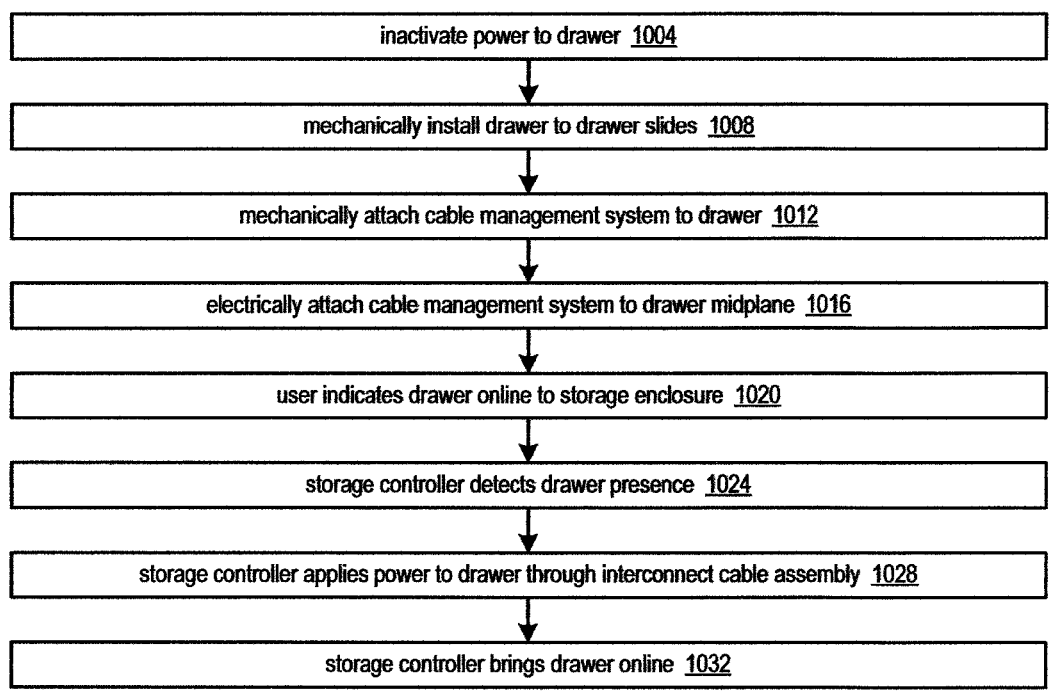

Fig. 10b Drawer removal process
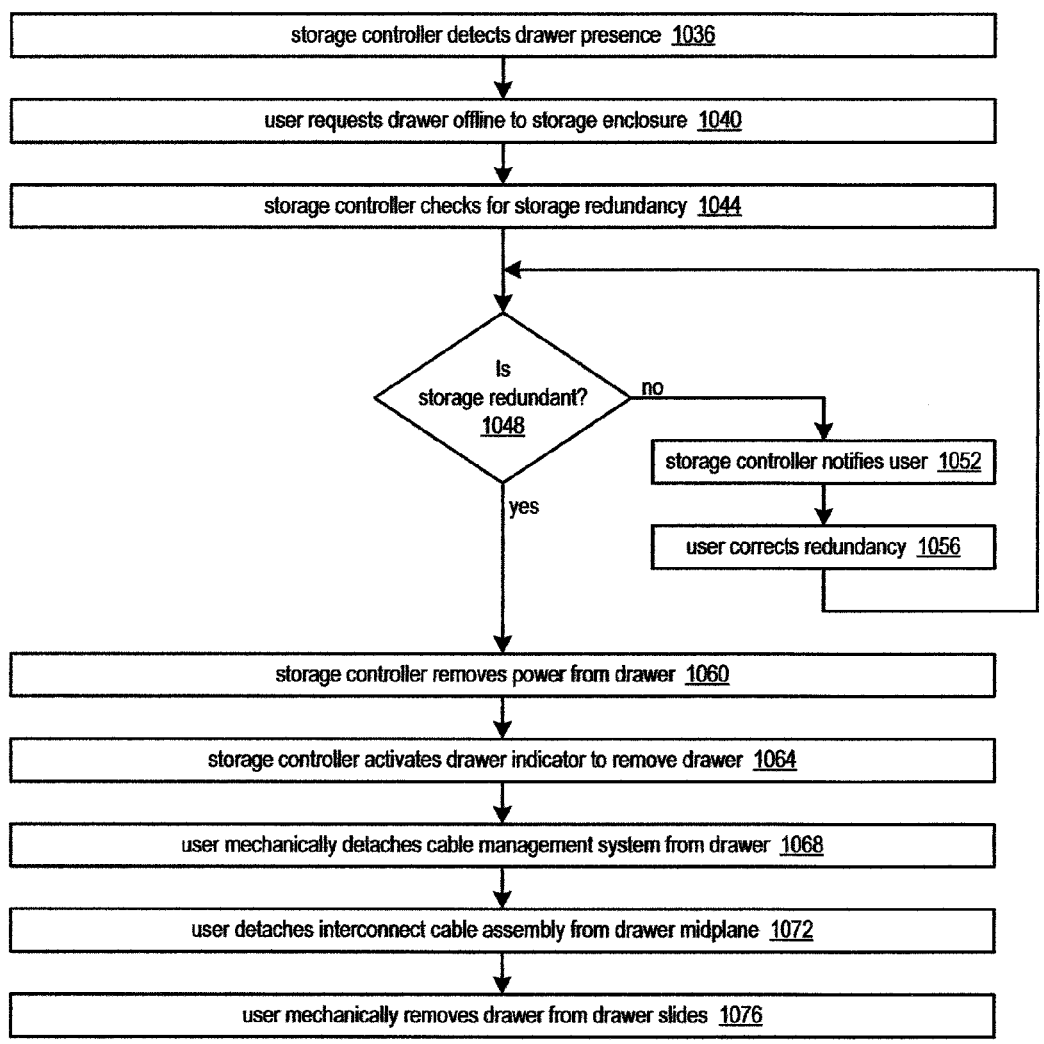

Fig. 11a  Mounted storage device
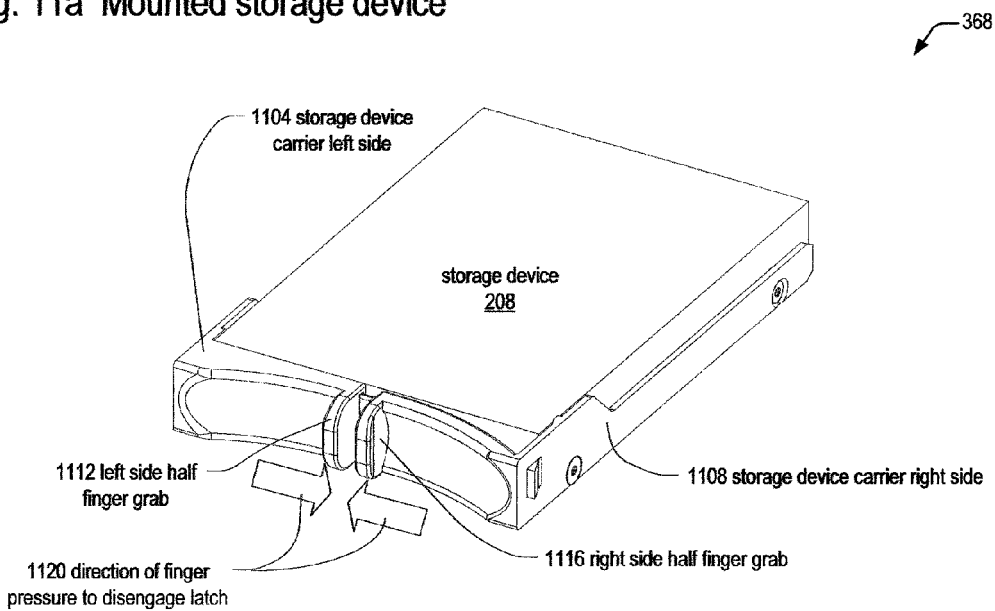
Fig. 11b  Stack of (4) mounted storage devices
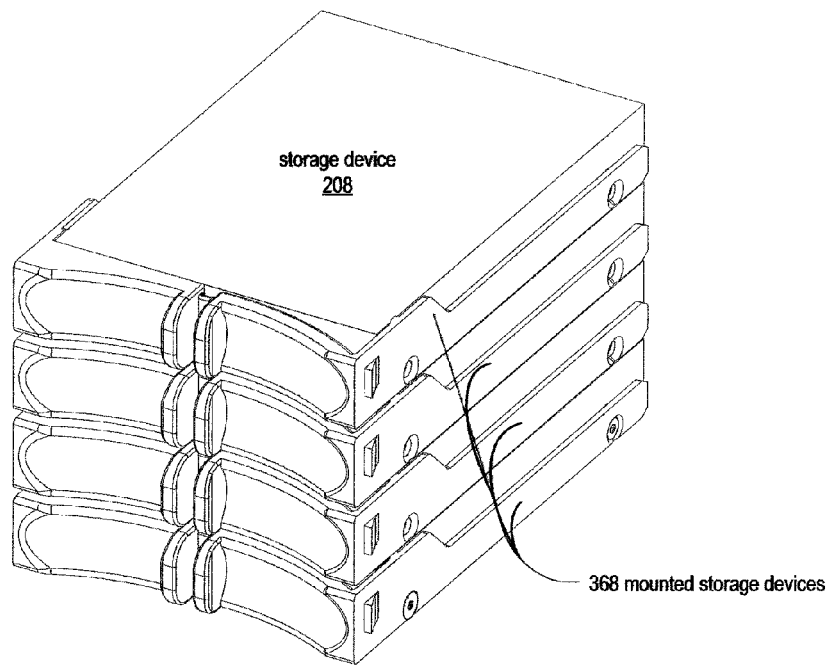

Fig. 12a  Front view of storage device carrier left side
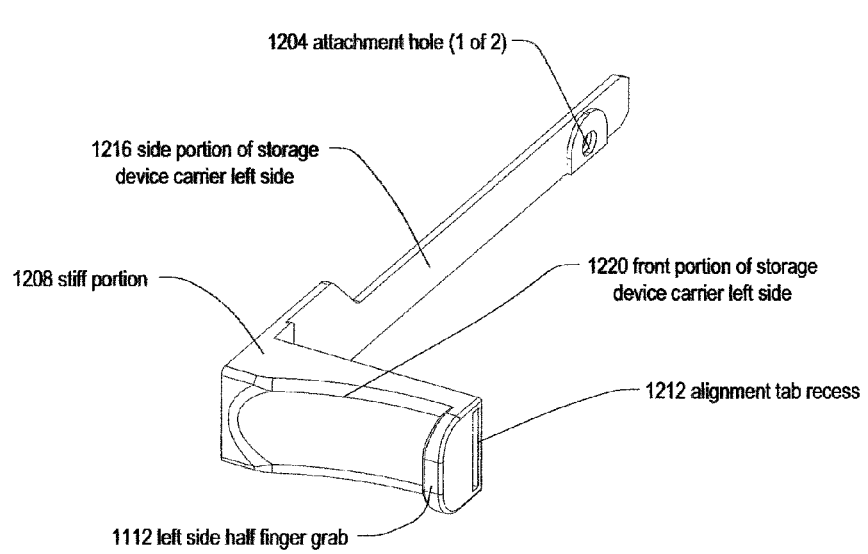
Fig. 12b  Rear view of storage device carrier left side
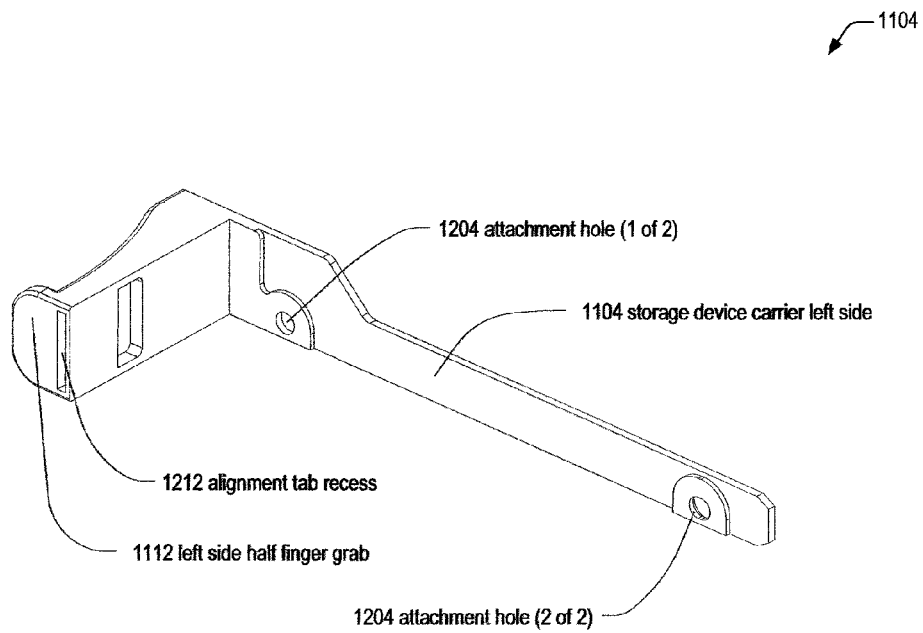

Fig. 13a  Front view of storage device carrier right side
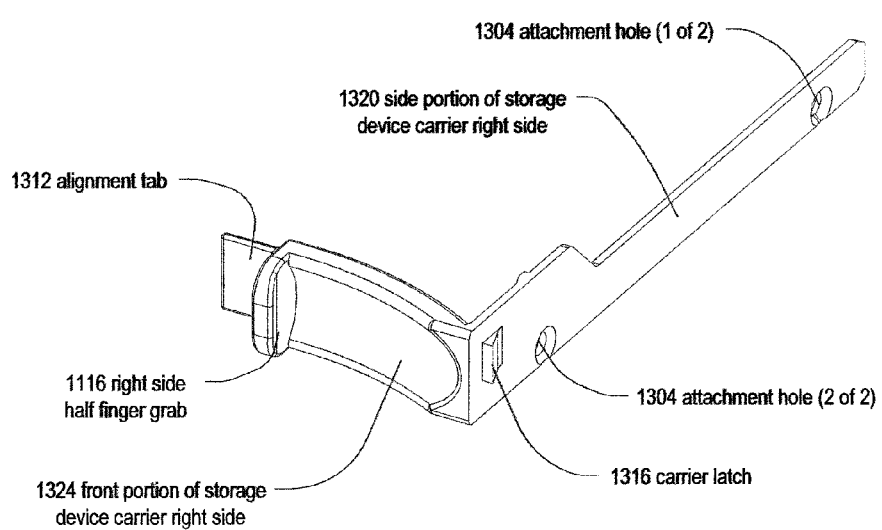
Fig. 13b  Rear view of storage device carrier right side
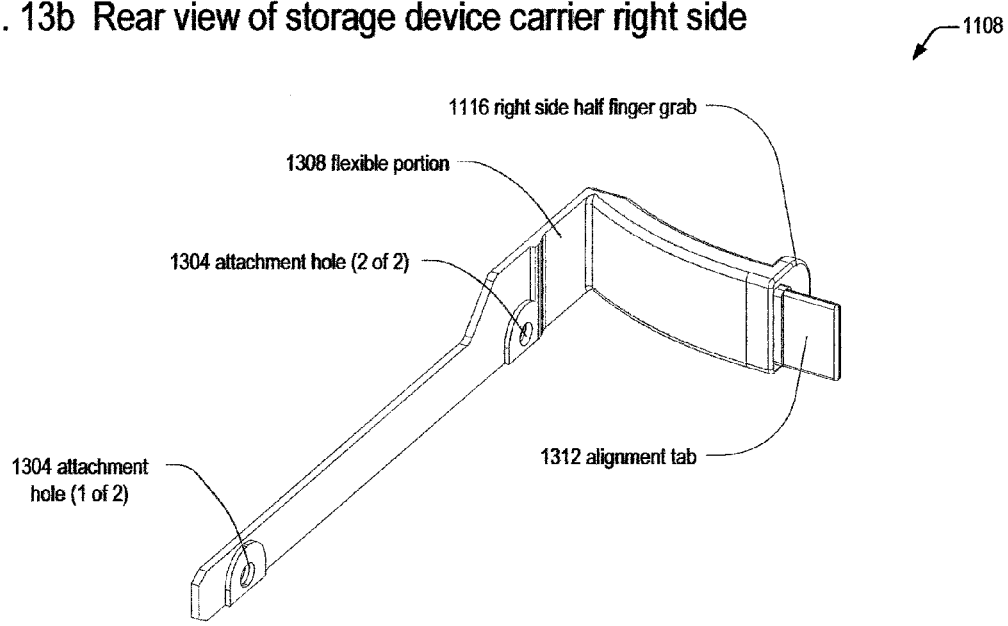

STORAGE DEVICE CARRIER FOR HIGH DENSITY STORAGE SYSTEM

CROSS REFERENCE TO RELATED APPLICATION(S)

This application is related to copending non-Provisional U.S. application Ser. No. 13/747,585, filed Jan. 23, 2013, entitled HIGH DENSITY DATA STORAGE SYSTEM WITH IMPROVED STORAGE DEVICE ACCESS (inventors Brenden Michael Rust and Charles Powell Morris), copending non-Provisional U.S. application Ser. No. 13/747,609, filed Jan. 23, 2013, entitled STORAGE ENCLOSURE WITH INDEPENDENT STORAGE DEVICE DRAWERS (inventors Victor Key Pecone, Kevin James Lonergan, Brenden Michael Rust, and George Alexander Kalwitz), and copending non-Provisional U.S. application Ser. No. 13/747,623, filed Jan. 23, 2013, entitled SAFE RACKMOUNTABLE STORAGE ENCLOSURE (inventor Brenden Michael Rust).

FIELD

The present invention is directed to computer data storage systems. In particular, the present invention is directed to a storage device carrier for mounting a hot-pluggable storage device in a storage enclosure.

BACKGROUND

In data storage systems, data storage density is always increasing in response to market demand for increased data storage. Each new generation of storage devices increases storage density over previous generations of storage devices, and often in more compact form factors. For example, current enterprise 3.5" hard disk drives are presently available in 2 TB and 3 TB capacities, while 2.5" hard disk drives are presently available in 1 TB capacities. Additionally, storage subsystems are being designed to store increasing numbers of storage devices. For example, commercial storage systems are currently available that can store up to 60 storage devices in a 4 rack unit high (4U) rackmountable enclosure.

Traditionally, rackmountable storage enclosures utilize front access, where each storage device is individually mounted to a sled and is inserted or removed from the storage enclosure front. For example, conventional storage enclosures of this arrangement could mount 12 3.5" storage devices in a 2U enclosure, 16 3.5" storage devices in a 3U enclosure, or 25 2.5" storage devices in a 2U enclosure.

High-density storage systems include relatively large numbers of storage devices. In one approach of high-density storage systems, density has been increased by allowing multiple storage devices to be mounted on each front-accessible sled. In some cases, the sleds are wider than a single storage device, sometimes up to the total internal width of a rackmountable shelf. In other cases, the sleds are deeper. In most cases, the storage devices are usually accessed through the top of a sled, after the sled has been pulled out from the front of the storage enclosure. Some high-density storage systems arrange storage devices on both sides of a drawer, where some storage devices of the same drawer are accessed from the left side, and other storage devices are accessed from the right side.

It has been found in recent years that increased numbers of storage devices can be mounted in a single high density storage system by utilizing a "tombstone" storage device mounting approach. A "tombstone" storage system mounts all storage devices vertically on-end in an array of rows and columns, where top access is required for all storage devices. In order to access a storage device in a "tombstone" system, a drawer mounting storage devices of the high-density storage system is usually slid forward on rails. The drawer must be slid forward far enough so that a top cover exposing all storage devices may be removed. A user or system administrator then stands over the top of the drawer and performs any necessary maintenance operation with the storage devices. Although the "tombstone" approach is very space efficient and can mount a large number of storage devices, it has several disadvantages. First, "tombstone" high density storage systems are usually quite heavy and difficult for one or two people to install. Strong slides and mounting structures are required so the entire drawer may be entirely slid forward. Second, "tombstone" storage systems require top access. In some cases, this requires a ladder or other device so that a person can get over the top of the enclosure and service the storage enclosure accordingly. Third, when the storage device drawer is slid forward, the entire weight of the drawer is forward of the rack rails of the rack the system is mounted within, possibly making the entire rack unstable and able to tip over.

SUMMARY

The present invention is directed to solving disadvantages of the prior art. In accordance with embodiments of the present invention, a storage device carrier is provided. The storage device carrier includes a first member and a second member. The first member includes a side portion and a front portion, perpendicularly coupled to an inside surface of a front end of the first member side portion. The first member includes a first portion of a finger grab. The second member includes a side portion and a latching feature. The latching feature is on an outside surface of a second member side portion. The second member also includes a front portion, perpendicularly coupled to an inside surface of a front end of the second member side portion. The second member includes a second portion of the finger grab.

In accordance with other embodiments of the present invention, a storage system is provided. The storage system includes a plurality of front-mounted drawers. Each of the plurality of front-mounted drawers includes one or more mounted storage devices. Each of the one or more mounted storage devices includes a storage device and a first member coupled to a first side of the storage device. The first member includes a side portion and a front portion, perpendicularly coupled to an inside surface of a front end of the first member side portion. The front end of the first member includes a first portion of a finger grab. Each of the one or more mounted storage devices also includes a second member, coupled to a second side of the storage device opposite the first side of the storage device. The second member also includes a side portion. The side portion of the second member includes a latching feature, where the latching feature is on an outside surface of the second member side portion. The second member also includes a front portion, perpendicularly coupled to an inside surface of a front end of the second member side portion. The front portion of the second member includes a second portion of the finger grab.

In accordance with yet other embodiments of the present invention, a method for removing a mounted storage device from a drawer of a storage enclosure is provided. The method includes pushing a second portion of a finger grab of the mounted storage device horizontally toward a first portion of a finger grab of the mounted storage device. The second portion of the finger grab is on a front portion of a second member and the first portion of the finger grab on a front portion of a first member, wherein the front portion of the first member is perpendicularly coupled to an inside surface of a front end of a side portion of the first member, wherein the side portion of the first member is attached to a first side of the storage device; wherein the front portion of the second member is perpendicularly coupled to an inside surface of a front end of a side portion of the second member, wherein the side portion of the second member is attached to a second side of the storage device opposite the first side of the storage device. The method also includes pulling the mounted storage device from the drawer, the mounted storage device including the storage device fastened to the first member and the second member. Pushing a second portion of a finger grab of the mounted storage device horizontally toward a first portion of a finger grab releases a latching feature in the side portion of the second member from contact with a corresponding feature in the drawer.

An advantage of the present invention is that it provides a simple, reliable, and low-cost storage device carrier. By forming the storage device carrier in two sections with integral features in each section, only mounting screws or other hardware is required to attach the storage device carrier to a storage device. Low cost is important in high-density storage systems since large numbers of mounted storage devices are generally present and each mounted storage device requires a storage device carrier.

Another advantage of the present invention is it provides features to maintain relative alignment between each of the two storage device carrier sections. One section has a projecting tab and the other section has a recess for accepting the projecting tab. The projecting tab is aligned with the recess and slides within the recess when a user or system administrator pinches finger grabs on both sections together in order to insert or remove a mounted storage device from a drawer.

Additional features and advantages of embodiments of the present invention will become more readily apparent from the following description, particularly when taken together with the accompanying drawings.

BRIEF DESCRIPTION OF THE DRAWINGS

FIG. 1 is a block diagram illustrating components of a data storage network in accordance with embodiments of the present invention.

FIG. 2a is a block diagram illustrating components of a first host-based data storage system in accordance with embodiments of the present invention.

FIG. 2b is a block diagram illustrating components of a first non host-based data storage system in accordance with embodiments of the present invention.

FIG. 2c is a block diagram illustrating components of a second host-based data storage system in accordance with embodiments of the present invention.

FIG. 2d is a block diagram illustrating components of a second non-host-based data storage system in accordance with embodiments of the present invention.

FIG. 3a is a diagram illustrating a storage enclosure in accordance with embodiments of the present invention.

FIG. 3b is a diagram illustrating a storage enclosure chassis in accordance with embodiments of the present invention.

FIG. 3c is a diagram illustrating chassis components of a storage enclosure without drawers in accordance with embodiments of the present invention.

FIG. 3d is a diagram illustrating chassis components of a storage enclosure including drawers in accordance with embodiments of the present invention.

FIG. 3e is a diagram illustrating a storage enclosure with a left drawer extended in accordance with embodiments of the present invention.

FIG. 3f is a diagram illustrating a storage enclosure with a left drawer extended in accordance with embodiments of the present invention.

FIG. 3g is a diagram illustrating a storage enclosure with a center drawer extended in accordance with embodiments of the present invention.

FIG. 3h is a diagram illustrating a storage enclosure with a left drawer extended in accordance with embodiments of the present invention.

FIG. 3i is a diagram illustrating a storage enclosure with a right drawer extended in accordance with embodiments of the present invention.

FIG. 3j is a diagram illustrating a storage enclosure right drawer configuration in accordance with embodiments of the present invention.

FIG. 4a is a diagram illustrating left and right drawer configurations in accordance with embodiments of the present invention.

FIG. 4b is a diagram illustrating drawers and power supply modules in accordance with embodiments of the present invention.

FIG. 4c is a diagram illustrating a drawer storage device mounting configuration in accordance with embodiments of the present invention.

FIG. 4d is a diagram illustrating detail A for a drawer storage device mounting configuration in accordance with embodiments of the present invention.

FIG. 4e is a diagram illustrating a storage controller module in accordance with embodiments of the present invention.

FIG. 4f is a diagram illustrating chassis and drawer midplanes in accordance with embodiments of the present invention.

FIG. 4g is a diagram illustrating a chassis cutaway side view in accordance with embodiments of the present invention.

FIG. 5a is a diagram illustrating a storage enclosure in a rack with no drawers extended in accordance with embodiments of the present invention.

FIG. 5b is a diagram illustrating a storage enclosure in a rack with all drawers extended in accordance with embodiments of the present invention.

FIG. 6 is a block diagram illustrating a storage enclosure in accordance with embodiments of the present invention.

FIG. 7 is a block diagram illustrating a drawer midplane in accordance with embodiments of the present invention.

FIG. 8 is a block diagram illustrating a drawer interconnection to a storage enclosure in accordance with embodiments of the present invention.

FIG. 9 is a block diagram illustrating storage enclosure DC power distribution in accordance with embodiments of the present invention.

FIG. 10a is a flowchart illustrating a drawer installation process in accordance with embodiments of the present invention.

FIG. 10b is a flowchart illustrating a drawer removal process in accordance with embodiments of the present invention.

FIG. 11a is a diagram illustrating a mounted storage device in accordance with embodiments of the present invention.

FIG. 11b is a diagram illustrating a stack of (4) mounted storage devices in accordance with embodiments of the present invention.

FIG. 12*a* is a diagram illustrating a front view of a storage device carrier left side in accordance with embodiments of the present invention.

FIG. 12*b* is a diagram illustrating a rear view of a storage device carrier left side in accordance with embodiments of the present invention.

FIG. 13*a* is a diagram illustrating a front view of a storage device carrier right side in accordance with embodiments of the present invention.

FIG. 13*b* is a diagram illustrating a rear view of a storage device carrier right side in accordance with embodiments of the present invention.

DETAILED DESCRIPTION

The present inventors have observed various human factors engineering problems with high-density storage systems. High-density storage systems provide a storage enclosure containing large numbers of storage devices, where each storage device is not able to be individually inserted or removed to or from the storage enclosure through the front surface of the storage enclosure. In a rackmountable storage enclosure that is 2 rack units high ("2U"), a high-density storage system would therefore have more than 12 3.5" storage devices or 25 2.5" storage devices. In a rackmountable storage enclosure that is 3 rack units high ("3U"), a high-density storage system would therefore have more than 16 3.5" storage devices or 35 2.5" storage devices.

In order to accommodate greater numbers of storage devices, high-density storage systems use other mounting arrangements for storage devices. One approach is to use a "tombstone" storage enclosure, where all storage devices are accessed through the top surface, after pulling a rackmountable drawer including the storage enclosure forward such that storage device access is not blocked by the rack itself or another rackmountable module above the drawer containing the storage enclosure. A ladder is generally required to access the storage devices through the top of the storage enclosure, since a user needs to see which storage device to physically remove or insert.

Another approach is to use a series of narrow front-accessible sleds, where each sled mounts a fixed number of storage devices. In some cases, storage devices are mounted in a "tandem" arrangement, where a longer storage device carrier mounts 2, 3, or 4 storage devices. This arrangement often has a front storage device carrier profile that is the same as a conventional storage device carrier mounting only a single storage device, and achieves high-density through greater depth of storage device mounting on a carrier, and possibly a deeper storage enclosure chassis.

Yet another approach is to use a series of wide side-accessible sleds, where each sled mounts a fixed number of storage devices. In some cases, each sled is the full width of the storage enclosure, and provides access to storage devices from both the left and the right sides.

These alternative packaging approaches for high-density storage systems introduce various human factor problems that negatively impact the accessibility of storage devices or installation/removal safety of modules or the entire storage enclosure from a standard 19" rack. For example, "tombstone" storage enclosures require top access to insert or remove any storage devices. In some cases, this requires a ladder in order for service personnel to get above the storage enclosure, especially if the enclosure is mounted in the upper space of a tall rack. Additionally, "tombstone" storage enclosures are almost always mounted on drawer slides, and the entire storage enclosure is pulled forward to provide top-level access. In addition to the possible requirement for a ladder, a safety factor is introduced since pulling the storage enclosure forward moves a significant portion of storage enclosure mass forward of the rack rails, and may introduce a front tip-over danger in a sparsely populated rack.

Although the present invention is described with respect to SAS technology, it should be understood that the inventive aspects of the present invention apply to any such storage device interface technology including but not limited to Fibre Channel, parallel SCSI, Parallel ATA, Serial ATA (SATA), or SSA.

Referring now to FIG. 1, a block diagram illustrating components of a data storage network 100 in accordance with embodiments of the present invention is shown. Data storage network 100 provides interconnection between one or more host computers 108 and one or more storage enclosures 112. Network 104 includes networking communication technologies suitable for high-volume data transfers between host computers 108 and storage enclosures 112. Such technologies include Fiber Channel, Ethernet, SSA, SAS, iSCSI, Infiniband, ESCON, and FICON. Network 104 includes, but is not limited to local area networks (LANs) and storage area networks (SANs).

Host computers 108 execute application programs, and communicate with other host computers 108 or storage enclosures 112 through network 104. Storage enclosures 112 include storage devices that provide mass data storage. Storage devices include hard disk drives, tape drives, optical drives, and solid state drives. In some embodiments, data storage network 100 includes one or more management computers 116. Management computers 116 monitor network 104, and provide error monitoring, configuration, and control functions. In most embodiments, management computer 116 includes a graphical user interface (GUI) 120, through which users or system administrators interact with management computer 116. In some embodiments, management computer 116 interfaces with storage enclosures 112 through network 104. In other embodiments, management computer 116 interfaces with storage enclosures 112 through a different connection or network other than network 104. Although three host computers 108*a*, 108*b*, 108*c* and three storage enclosures 112*a*, 112*b*, 112*c* are shown in FIG. 1, network 104 includes any number of host computers 108 and storage enclosures 112.

Referring now to FIG. 2*a*, a block diagram illustrating components of a first host-based data storage system 200 incorporating a JBOD storage enclosure 224 in accordance with embodiments of the present invention is shown. The first host-based data storage system 200 includes one or more host computers 108. Host computer 108 is generally a server, but could also be a desktop or mobile computer. Host computer 108 executes application programs that generate read and write requests to storage devices 208*a*-208*z*. Host computer 108 includes one or more storage controllers 204, although only a single storage controller 204 is illustrated for clarity. In one embodiment, storage controller 204 is a host bus adapter. In another embodiment, storage controller 204 is a controller incorporating Redundant Array of Inexpensive Disks (RAID) technology. In yet another embodiment, storage controller 204 represents a pair of dual-redundant RAID controllers. Storage controller 204 may either be integrated on the motherboard of host computer 108, or may be an add-in board or other form of assembly in host computer 108. Storage controller 204 is well understood in the data storage art and is not limited to any particular implementation or configuration.

Storage controller 204 transfers data to and from storage devices 208*a*-208*z* in JBOD storage enclosure 224, over SAS links 220 and wide SAS link 216. In one embodiment, wide SAS link 216 includes 4 SAS lanes. JBOD storage enclosure 224 includes one or more SAS expanders 212, which perform switching functions, and transfers data and commands between storage controller 204 and storage devices 208a-208z. In general, the transmit and receive paths of SAS links 220 to storage devices 208 are single lane SAS connections. However, in the future it is possible each transmit or receive path could be a multiple lane SAS link 216. Each SAS link 220 between SAS expander 212 and storage devices 208 includes separate transmit and receive paths, and each storage device 208 generally has two ports for independent interconnection to different SAS expanders 212 as illustrated in FIG. 6.

Referring now to FIG. 2b, a block diagram illustrating components of a first non host-based data storage system 232 incorporating a storage enclosure 112 in accordance with embodiments of the present invention is shown. Host computer 108 performs most of the functions previously described, although the "controller" or "storage controller" functions are instead performed by storage controller 204 in storage enclosure 112. Storage enclosure 112 of FIG. 2b is therefore similar to JBOD storage enclosure 224 of FIG. 2a, except that one or more storage controllers 204 are present in storage enclosure 112. Storage controller 204 is described in more detail with respect to FIG. 6. In one embodiment, storage controller 204 is a RAID controller. In another embodiment, storage controller 204 represents a pair of dual redundant RAID controllers. Host computer 108 communicates with storage enclosure 112, including storage controller 204, over host bus or network 228. Host bus or network 228 is any suitable bus or network that allows high speed data transfer between host computer 108 and storage controller 204. Examples of host bus or network 228 include, but are not limited to, SCSI, Fibre Channel, SSA, SCSI, SAS, iSCSI, Ethernet, Infiniband, ESCON, ATM, and FICON. In some embodiments, host bus or network 228 is a storage area network (SAN) or local area network (LAN).

Referring now to FIG. 2c, a block diagram illustrating components of a second host-based data storage system 240 incorporating JBOD storage enclosures 224a, 224b, and 224c in accordance with embodiments of the present invention is shown. Second host-based data storage system 240 is similar to first host-based data storage system 200 of FIG. 2a, but additional JBOD storage enclosures 224b, 224c are provided to support additional storage devices 208c-208f. In one embodiment, storage controller 204 is a host bus adapter. In another embodiment, storage controller 204 is a RAID controller. In yet another embodiment, storage controller 204 represents a pair of dual-redundant RAID controllers. In order to support additional JBOD storage enclosures 224b, 224c, SAS expanders 212 utilize daisy chain buses 236. Daisy chain bus 236 utilizes the same protocol as SAS links 216, 220, and is generally a SAS wide bus 216 having four SAS lanes. Daisy chain bus 236a interconnects SAS expander 212a and SAS expander 212b. Daisy chain bus 236b interconnects SAS expander 212b and SAS expander 212c. Daisy chain bus 236c interconnects SAS expander 212c and another storage enclosure 112, in a similar fashion to daisy chain buses 236a and 236b.

In one embodiment, each JBOD storage enclosure 224 supports 48 storage devices 208 and each storage controller 204 supports up to 128 storage devices 208. However, in other embodiments each JBOD storage enclosure 224 may support more or fewer than 48 storage devices 208, and each storage controller 204 may support more or fewer than 128 storage devices 208.

Referring now to FIG. 2d, a block diagram illustrating components of a second non-host-based data storage system 244 in accordance with embodiments of the present invention is shown. Second non-host based data storage system 244 is similar to first non-host-based data storage system 232 of FIG. 2b, but additional storage enclosures 112b, 112c are provided to support additional storage devices 208c-208f. In one embodiment, storage controller 204 is a RAID controller. In another embodiment, storage controller 204 represents a pair of dual redundant RAID controllers. In order to support additional storage enclosures 112b, 112c, SAS expanders 212 utilize daisy chain buses 236. Daisy chain buses 236 utilize the same protocol as SAS links 220, 216, and are generally a SAS wide bus 216 having four SAS lanes. Daisy chain bus 236a interconnects SAS expander 212a and SAS expander 212b. Daisy chain bus 236b interconnects SAS expander 212b and SAS expander 212c. Daisy chain bus 236c interconnects SAS expander 212c and another storage enclosure 112, in a similar fashion to daisy chain buses 236a and 236b. In one embodiment, each storage enclosure 112 supports 48 storage devices 208 and each storage controller 204 supports up to 128 storage devices 208. However, in other embodiments each storage enclosure 112 may support more or fewer than 48 storage devices 208, and each storage controller 204 may support more or fewer than 128 storage devices 208.

Referring now to FIG. 3a, a diagram illustrating a storage enclosure 112, 224 in accordance with embodiments of the present invention is shown. Storage enclosure 112,224 is a high-density storage system that provides storage for a large number of storage devices 208. In some embodiments, storage enclosure 112,224 is able to be mounted within a 19 inch rack in conjunction with other similar or dissimilar modules. In the preferred embodiment, storage enclosure 112, 224 is two rack units high. Storage enclosure 112, 224 includes a chassis 304, which is generally constructed of steel, aluminum, or other materials that provide appropriate strength, rigidity, and compatibility with EMI/EMC standards. Chassis 304 has a top surface 308, a bottom surface 312, a rear surface, a front surface, and two side surfaces.

In some embodiments, storage enclosure 112, 224 includes a front bezel 316. The front bezel 316 is attached to the front surface of chassis 304, and provides an aesthetic front cover for storage enclosure 112, 224. The front bezel 316 includes finger grabs for user access without requiring tools and some embodiments includes simple controls, such as pushbuttons, and LED or alphanumeric displays. Front bezel 316 also includes various holes through which cooling air is drawn into chassis 304 to cool storage devices 208 and other electronic assemblies of storage enclosure 112, 224.

Referring now to FIG. 3b, a diagram illustrating a storage enclosure chassis 304 in accordance with embodiments of the present invention is shown. The chassis 304 includes chassis side surfaces 328. Chassis side surfaces 328 include a left side and a right side. The chassis 304 also includes a chassis front surface 320, which the front bezel 316 attaches to and a plurality of storage device drawers are inserted or removed from the chassis. The chassis 304 further includes a chassis rear surface 324, through which power supply 332 and storage controller modules 336 are inserted or removed.

Referring now to FIG. 3c, a diagram illustrating chassis components of a storage enclosure 112 without drawers 352 in accordance with embodiments of the present invention is shown. FIG. 3c illustrates chassis 304 of FIG. 3b with the addition of a chassis midplane 340, power supplies 332, and storage controller module 336. The chassis midplane 340 provides electrical signal and power interconnection between each of two redundant power supplies 332a, 332b, each of two redundant storage controller modules 336, and drawers 352. Each of the modules in chassis 304 is designed for redundant operation.

Chassis 304 includes at least one drawer slide 348 for each of the drawers 352 that mount the storage devices 208. Drawer slides 348 provide a bearing surface for each drawer 352, allowing each drawer 352 to be smoothly inserted or removed to or from chassis 304. Each of the drawer slides 348 includes a mechanical latch hole 350, or other latching mechanism. Mechanical latch hole 350 mates with a mechanical latch in the bottom surface of drawer 352, allowing drawer 352 to be removed from chassis 304.

Storage enclosure 112 allows each drawer 352 to be fully operational when the drawer 352 is fully extended through the front surface of the chassis 320. Therefore, it is necessary to provide flexible power and interconnect signal cables between the chassis midplane 340 and each drawer 352. Drawer cable guides 344 are provided in chassis 304 to protect the power and interconnect signal cables as a drawer 352 is being inserted or extended/removed from the chassis 304.

Referring now to FIG. 3d, a diagram illustrating chassis components of a storage enclosure 112 including drawers 352 in accordance with embodiments of the present invention are shown. FIG. 3d illustrates the chassis 304 of FIG. 3c with the addition of three drawers 352. Although only a single storage controller module 336 is shown, in most embodiments two such storage controller modules 336 would be present. In some embodiments, the storage enclosure is a JBOD (Just a Bunch of Disks) storage enclosure 224, and has no storage controller modules 336 present.

Drawers 352 provide mounting for storage devices 208. Each drawer 352 stores up to a predetermined number of storage devices 208 and the components of each drawer 352 is described in later Figures. In the preferred embodiment, each drawer 352 may store up to sixteen storage devices 208. Each drawer 352 is mechanically independent of any other drawers 352 in the storage enclosure 112, 224. Mechanically independent means each drawer 352 may be added, removed, or extended from the chassis 304 regardless of the presence, absence, or extended position of any other drawer 352.

Referring now to FIG. 3e, a diagram illustrating a storage enclosure 112, 224 with a left drawer 364 extended in accordance with embodiments of the present invention is shown. Each drawer 352 is individually extendable or retractable from chassis 304. In one embodiment, only one drawer 352 is extendable at the same time, and a mechanical and/or electrical interlock system prevents more than one drawer 352 from being extended at the same time. Mounted storage devices 368 each include a single storage device 208, and each mounted storage device 368 may be individually removed or inserted into left drawer 364 or any other drawer 352 of storage enclosure 112, 224. It should be noted that all mounted storage devices 368 of a left drawer 364 configuration are inserted or removed through the right side of the drawer 364.

Associated with each drawer 352, including left drawer 364, is a cable management system 356. Cable management system 356 protects power and interconnect signal cabling between the chassis midplane 340 and each drawer 352. In the preferred embodiment, cable management system 356 includes a drawer cable guide 344 and a flexible cable chain 360. The flexible cable chain 360 is provided for each drawer 352 and moves linearly with left drawer 364 as the left drawer 364 is extended from or pushed into the storage enclosure 112, 224. Flexible cable chain 360 is constructed in such a fashion as to limit any sideways movement of the flexible cable chain and allow only linear movement in concert with the drawer 352 the flexible cable chain 360 is attached to. Power and interconnect signal cables run within the drawer cable guide 344 and the flexible cable chain 360. In the preferred embodiment, the flexible cable chain is IGUS part number 08-10-025-0 for the chain itself, and 080-10-12 for the mounting end-links.

Referring now to FIG. 3f, a diagram illustrating a storage enclosure 112, 224 with a left drawer 364 extended in accordance with embodiments of the present invention is shown. FIG. 3f shows a left drawer 364 extended from the storage enclosure 112, 224. With the left drawer 364 extended, the cable management system 356 for the center drawer 372 is more clearly visible in a retracted configuration.

Referring now to FIG. 3g, a diagram illustrating a storage enclosure 112, 224 with a center drawer 372 extended in accordance with embodiments of the present invention is shown. In the embodiment shown in FIG. 3g, the center drawer 372 has the same mounted storage device 368 configuration as the left drawer 364. The mounted storage device 368 configuration refers to the side of a drawer 352 (left or right) through which all mounted storage devices 368 are accessed. In other embodiments, the mounted storage device 368 configuration of the center drawer 372 may be a right drawer 380 configuration.

A storage enclosure 112, 224 of the present invention may have no, one, or more than one center drawer 372. However, storage enclosure 112, 224 includes at least one left drawer 364, and a least one right drawer 380.

Referring now to FIG. 3h, a diagram illustrating a storage enclosure 112 with a left drawer 364 extended in accordance with embodiments of the present invention is shown. FIG. 3h illustrates left drawer 364 extended a predetermined distance 376 from the chassis 304. The predetermined distance 376 is the distance the drawers 352 must be extended from the chassis 304 in order to access all mounted storage devices 368 of a drawer 352. The predetermined distance 376 is the same for all drawers 352 of a storage enclosure 112, 224, and in a preferred embodiment is 330 mm. When any drawer 352 is fully extended from the chassis 304, the drawer is extended the predetermined distance 376.

During normal operation, when a drawer 352 has not failed or is being serviced, each drawer 352 remains fully functional when the drawer 352 is fully extended from the chassis 304. Fully functional means one or more power supplies 332 provide DC power to the fully extended drawer 352 and each mounted storage device 368 in the drawer 352, and communication paths 828 are enabled between each mounted storage device 368 and the chassis midplane 340.

Referring now to FIG. 3i, a diagram illustrating a storage enclosure 112, 224 with a right drawer 380 extended in accordance with embodiments of the present invention is shown. The right drawer 380 includes a fixed number of mounted storage devices 368, and is extendable the same predetermined distance 376 as the other drawers 352 of storage enclosure 112, 224. The right drawer 380 has a mirror image configuration compared to the left drawer 364, as will be described with reference to FIG. 4a.

Referring now to FIG. 3j, a diagram illustrating a storage enclosure right drawer 380 configuration in accordance with embodiments of the present invention is shown. FIG. 3j shows additional detail of the right drawer 380 configuration. The same details apply to other drawers 352 of storage enclosure 112, 224. It should be noted that all mounted storage devices 368 of a right drawer 380 configuration are inserted or removed through the left side of the drawer 380.

The right drawer 380 includes a drawer chassis 388. The drawer chassis 388 is a sheet metal assembly that supports mounted storage devices 368 and other assemblies of the right drawer 380. Left drawers 364 and center drawers 372 also have a drawer chassis 388. Each mounted storage device 368 includes a storage device 208. However, not every bay in the drawer chassis 388 for a mounted storage device 368 is necessarily populated with a storage device 208. For example, there may be only one mounted storage device 368 in a drawer 352, or even no mounted storage devices 368 in a drawer 352. In the right drawer configuration of FIG. 3j, there are 16 mounted storage devices 368 present, organized as four columns of four mounted storage devices 368 per column. In other embodiments, there may be more than 16 or less than 16 mounted storage devices 368 in a drawer 352, and mounted storage devices 368 may be organized into different numbers of columns and mounted storage devices 368 per column than shown. Each mounted storage device 368 is independently insertable or removable to or from a drawer 352, and access does not depend on the position, presence, or absence of any other mounted storage device 368 in the same drawer 352.

Referring now to FIG. 4a, a diagram illustrating left and right drawer 352 configurations in accordance with embodiments of the present invention is shown. In accordance with the present invention, left drawer 364 is of a left drawer configuration 404. A left drawer configuration 404 provides only right side access to mounted storage devices 368. No mounted storage devices 368 are accessed through the left side of a left drawer configuration 404.

In accordance with the present invention, right drawer 380 is of a right drawer configuration 408. A right drawer configuration 408 provides only left side access to mounted storage devices 368. No mounted storage devices 368 are accessed through the right side of a right drawer configuration 408.

As stated previously, any center drawer 372 may have a left drawer configuration 404 or right drawer configuration 408, and the present invention places no limitations on the number of center drawers 372 that may be present of the specific left/right configuration 404/408 of any center drawer 372.

Each drawer 352 of a left drawer configuration 404 or right drawer configuration 408 includes a drawer top 412, a drawer bottom 416, and drawer indicators and controls 424. In some embodiments, drawers 352 may have a drawer pull 420 to facilitate insertion or removal of a drawer 352. In some embodiments, the drawer bottom 416 includes a mechanical latch that mates with a mechanical latch hole 350 of the chassis 304 as previously described.

Referring now to FIG. 4b, a diagram illustrating drawers 352 and power supply 332 modules in accordance with embodiments of the present invention is shown. Drawers 352 are as either a left drawer configuration 404 or a right drawer configuration 408, and include up to a fixed number of mounted storage devices 368. Power supplies 332 receive external AC or DC power, and provide regulated DC power to the drawers 352, storage controller modules 336, and chassis midplane 340.

Referring now to FIG. 4c, a diagram illustrating a drawer storage device mounting configuration 404 in accordance with embodiments of the present invention is shown. Although a drawer 352 of the left drawer configuration 404 is illustrated, it should be understood that a drawer 352 of the right drawer configuration 408 is the mirror image of the left drawer configuration 404.

The drawer chassis 388 provides support and mounting for mounted storage devices 368 and the drawer midplane 396. Detail A 428 is provided with additional description in FIG. 4d.

Referring now to FIG. 4d, a diagram illustrating detail A for a drawer storage device mounting configuration 404 in accordance with embodiments of the present invention is shown. Drawer chassis 388 provides a mounted storage device rail 432 on each side of a mounting bay for mounted storage devices 368. The mounted storage device rail 432 provide mechanical support for each mounted storage device 368, and allows a mounted storage device 368 to be inserted or removed to or from the drawer chassis 388 without interference. Mounting bays for mounted storage devices 368 include a latching hole 436. The latching hole 436 engages a carrier latch 1316 in the side of mounted storage device 368 in order to lock the mounted storage device 368 into the mounting bay when the mounted storage device 368 is fully inserted into the mounting bay.

Referring now to FIG. 4e, a diagram illustrating a storage controller module 336 in accordance with embodiments of the present invention is shown. The storage controller module 336 includes a storage controller 204. In a preferred embodiment, there are two storage controller modules 336 in a storage enclosure 112, or no storage controller modules 336 in a JBOD storage enclosure 224. Storage enclosures 112 with no storage controller modules 336 are JBOD storage enclosures 224. Storage controller module 336 interfaces with chassis midplane 340 through chassis midplane connector 440.

Referring now to FIG. 4f, a diagram illustrating chassis 340 and drawer 396 midplanes in accordance with embodiments of the present invention is shown. Each drawer 352 has a drawer midplane 396, which is described in more detail with respect to FIGS. 7 and 8. For engineering debug purposes, it may be advantageous to provide hard electromechanical mounting between each drawer midplane 396 and the chassis midplane 340, as shown. However, storage enclosures 112, 224 of the present invention utilize a cable management system 356 in lieu of hard mounting between chassis midplane 340 and each drawer midplane 396.

Referring now to FIG. 4g, a diagram illustrating a chassis 304 cutaway side view in accordance with embodiments of the present invention is shown. Chassis 304 includes a chassis front surface 320, a chassis rear surface 324, and a flexible cable chain 360. Power supplies 332 and storage controller modules 336 are inserted or removed to or from the chassis 304 through the chassis rear surface 324. Drawers 352 are inserted or removed to or from the chassis 304 through the chassis front surface 320. In a preferred embodiment, the chassis 304 is two rack units high.

Referring now to FIG. 5a, a diagram illustrating a storage enclosure 112, 224 in a rack 504 with no drawers 352 extended in accordance with embodiments of the present invention. The storage enclosure 112, 224 is mountable in a standard 19 inch rack 504, using standard mounting hardware at the front left and right corners of the chassis 304 and along the rear portions of the chassis side surfaces 328. The rack 504 includes front rack rails 504a, 504b and rear rack rails 504c, 504d. When thusly mounted in a rack 504, the storage enclosure 112, 224 is a rackmounted storage enclosure 508.

When each of the drawers 352 are fully populated with mounted storage devices 368, and fully pushed into the chassis 304, the center of mass 512 of the rackmounted storage enclosure 508 is generally centered between the left and right sides of the chassis 328 and between the front rack rails 504a, 504b and the rear rack rails 504c, 504d. Because the rackmounted storage enclosure 508 center of mass 512 is within the confines of the rails of rack 504, there is no moment outside the confines of the rack 504 that could contribute to the rack 504 tipping over and presenting a safety hazard.

Access to any drawer 352 or mounted storage device 368 is not affected by vertical position of the rackmounted storage enclosure 508 within a rack 504, or the presence or absence of other vertically adjacent storage enclosures or other modules either above or below the rackmounted storage enclosure 508.

Referring now to FIG. 5b, a diagram illustrating a storage enclosure in a rack 508 with all drawers 352 extended in accordance with embodiments of the present invention is shown. Each of the drawers 352 are extended the predetermined distance 376, which is the maximum distance a drawer 352 may be extended from the front surface of the chassis 320.

When each of the drawers 352 are fully populated with mounted storage devices 368, and fully extended from the chassis front surface 320, the center of mass 516 of the rackmounted storage enclosure 508 is generally centered between the left and right sides of the chassis 328 and is still between the front rack rails 504a, 504b and the rear rack rails 504c, 504d. Because the rackmounted storage enclosure 508 center of mass 516 is still within the confines of the rails of rack 504, there is no moment outside the confines of the rack 504 that could contribute to the rack 504 tipping over and presenting a safety hazard.

The rackmounted storage enclosure 508 presents a safe storage enclosure 112, 224 configuration by limiting the weight of the entire storage enclosure 112, 224 and any module within the storage enclosure 112, 224. The power supplies 332a, 332b and storage controller modules 336 in a preferred embodiment each weigh less than 4.2 lbs. or 1.9 Kg., and may be safely serviced by an individual person. The drawers 352 in a preferred embodiment each weigh less than 15 lbs when populated with 16 2.5 inch disk drive storage devices 208, and may be safely serviced by an individual person. The entire storage enclosure 112, when fully populated with two power supplies 332a, 332b, two storage controller modules 336, and three drawers 352 each populated with 16 2.5 inch disk drive storage devices 208, weighs less than 80 lbs. Storage enclosures 224 weigh less than 80 lbs. in the preferred embodiment, since no storage controller modules 336 are present.

Conventional rackmounted storage enclosures not incorporating the present invention in some cases require a single sled containing all modules of the rackmounted storage enclosure to be extended through the front surface of the conventional rackmounted storage enclosure in order to access storage devices. Because of the significant mass of all modules moved in a forward direction, the center of gravity is shifted outside the confines of the conventional rackmounted storage enclosure, thereby creating a forward-tipping moment. This moment may contribute to a tipping danger of the entire rack, which presents a safety hazard.

The rackmounted storage enclosure 508 of the present invention allows access to any mounted storage device 368 in any drawer 352, regardless of the presence of a wall 520 or similar surface parallel to and against the left side or the right side of the rack 504. Furthermore, all mounted storage devices 368 of the rackmounted storage enclosure 508 may be inserted or removed to or from all drawers 352 of the rackmounted storage enclosure 508 even if a wall 520 or similar surface is along both the left and right sides of the rack 504. Under these conditions, the wall 520 or similar surface projects forward of the rack 504 at least as far as a fully extended drawer 352. This unique feature provides side accessibility of any mounted storage device 368 at all times— even when the rack 504 is located in a very narrow closet or other structure. The present invention includes a left drawer configuration 404 in the left drawer 364, and a right drawer configuration 408 in the right drawer 380. This means that all mounted storage devices 368 in either a left drawer 364 or right drawer 380 are accessed toward the center line of the rackmounted storage enclosure 508, and any wall 520 as described earlier will not interfere with mounted storage device 368 access. Center drawers 372 may have either a left drawer configuration 404 or right drawer configuration 408. It is understood that any mounted storage device 368 of a center drawer 372 may be inserted or removed from the center drawer 372 regardless of the presence of any wall 520, since the length of mounted storage devices 368 are less than the width of a left drawer 364 or right drawer 380.

Referring now to FIG. 6, a block diagram illustrating a storage enclosure 112 in accordance with embodiments of the present invention is shown. Storage enclosure 112 includes two storage controllers 204a, 204b. However, in JBOD (Just a Bunch of Disks) embodiments, no storage controllers 204a, 204b are present. When two storage controllers 204a, 204b are present, they are usually configured as dual redundant storage controllers where either or both storage controller 204a, 204b may read or write to any storage device 208. In most embodiments, storage controllers 204a, 204b include Redundant Array of Inexpensive Disks (RAID) technology to improve performance and protect against the loss of storage devices 208.

Storage controllers 204a, 204b include a processor 604a, 604b which executes stored programs to control the operations of storage controllers 204a, 204b and reading/writing data between host computers 108 and storage devices 208. Processors 604a, 604b include any processing device suitable for use as an embedded processor for storage controller 204a, 204b, including RISC processors, X86 processors, ARM processors, and so on.

For clarity purposes, host I/O controllers are not shown in FIG. 6. Host I/O controllers are part of storage controllers 204a, 204b, and interact with host computers 108 through network 104. Interaction includes receiving read and write requests from host computers 108 and providing read data to host computers 108.

Storage controllers 204a, 204b also includes memory 608a, 608b. Memory 608a, 608b includes both volatile and non-volatile memories, and provides storage for stored programs executed by processors 604a, 604b, write caches, read caches, and other forms of temporary data storage.

SAS initiators 616a, 616b are protocol controllers for the I/O buses 220 to storage devices 208 and daisy chain buses 236 to JBOD storage enclosures 224. In the preferred embodiment, SAS initiators 616 implement the Serial Attached SCSI (SAS) protocol. In the preferred embodiment, SAS initiators 616 are SAS2008 "Falcon" devices from LSI Logic, Inc. In other embodiments, SAS initiators 616a, 616b are Fibre Channel, SSA, or SATA protocol controllers—or any other I.O interface suitable for connection to storage devices 208.

SAS initiators 616a, 616b are coupled to SAS root expanders 612a, 612b in order to provide SAS I/O signaling to each of the drawers 352 or expansion JBOD storage enclosures 224 controlled by storage controllers 204a, 204b. In non-SAS embodiments, SAS root expanders 612a, 612b may instead be hubs or switches to perform a similar I/O bus expansion function. SAS root expanders 612a, 612b provide independent communication paths 220 to one side of each drawer 352, and as daisy chain bus 236a, 236b to an expansion JBOD storage enclosure 224. In the preferred embodiment, SAS root expanders 612a, 612b are PMC PM8005 devices manufactured by PMC-Sierra. In other embodiments, SAS root expanders 612a, 612b are different devices than PMC PM8005 devices. SAS root expanders 612a, 612b also provide an alternate communication path to the other storage controller 204a, 204b to continue to provide access to storage devices 208 in the event of certain failures. For example, if SAS root expander 612a fails, SAS initiator 616a may still communicate with storage devices 208 by communicating through SAS root expander 612b.

FIG. 6 illustrates three drawers 352: drawer 0 352a, drawer 1 352b, and drawer 2 352c. Each drawer 352a, 352b, 352c of the preferred embodiment includes up to 16 storage devices 208. However, a given drawer 352 may include any number of storage devices 208. Storage devices 208 each include two communication paths, which are each routed to a different SAS expander 212 on the drawer midplane 396.

Each SAS expander 212 is routed to a different bus 220 and SAS root expander 612. In the preferred embodiment, SAS expanders 212 are PMC-Sierra PM8004 devices. In other embodiments, SAS expanders 212 are different devices than PMC PM8004 devices. The two communication paths to each storage device 208 provide redundancy to each storage device for greater communication availability, and in some cases higher performance by increasing the communication bandwidth to storage devices 208.

In embodiments where more data storage is required than is normally provided by a single storage enclosure 112, an expansion storage enclosure, or JBOD storage enclosure 224, is provided. Daisy chain buses 236 provide high-bandwidth data transfers to and from SAS expanders 212 in JBOD storage enclosures 224.

Referring now to FIG. 7, a block diagram illustrating a drawer midplane 396 in accordance with embodiments of the present invention is shown. The drawer midplane 396 provides interconnection between storage devices 208, drawer 352 electronics, and DC and signal cables within the cable management system 356.

Drawer midplane 396 communicates with SAS root expanders 612a, 612b through SAS buses 220 and SAS expanders 212a, 212b, respectively. SAS expanders 212a, 212b each communicate with storage devices 208 in the drawer 352 through SAS connections 716a, 716b, where an independent SAS connection 716 is provided to each storage device 208 from each SAS expander 212a, 212b. An I$^2$C bus 720 is provided between SAS expanders 212a, 212b in order to communicate between SAS expanders 212.

Drawer midplane 396 includes independent control logic 708a, 708b, which communicates storage device status 724 to and from each storage device 208, memory 704a, 704b, and SAS expanders 212a, 212b.

Memories 704a, 704b store execution code, configuration data, and management data for each drawer 352, and include flash and static RAM (SRAM) devices. SAS expanders 212 access memory devices 704a, 704b from their respective expansion buses in the drawers 352.

Finally, drawer midplane 396 includes temperature sensors 712a, 712b. Temperature sensors 712a, 712b measure the ambient temperature of the drawer midplane 396. SAS expanders 212a, 212b read the temperature sensors 712a, 712b, respectively, and report the ambient temperature to the processor 604a, 604b. In some embodiments, the processors 604a, 604b change fan speed of fans in the power supplies 332a, 332b or elsewhere in chassis 304 in response to changes in ambient temperature.

Referring now to FIG. 8, a block diagram illustrating a drawer 352 interconnection to a storage enclosure 112, 224 in accordance with embodiments of the present invention is shown. Drawer 352 includes drawer midplane 396, which was described with reference to FIG. 7. Drawer midplane 396 communicates directly with the chassis midplane 340 through an interconnect cable assembly 828 of the cable management system 356. The interconnect cable assembly 828 includes power and signal cables required by the drawer midplane 396 and storage devices 208 within the drawer.

The drawer midplane 396 includes drawer indicators and controls 424. In one embodiment, drawer indicators and controls 424 includes a pushbutton 804, which allows a user to indicate to the processors 604a, 604b that either a user desires to remove a drawer 352 from the chassis 304 (through remove drawer request 820), or a drawer 352 has been installed to the chassis 304 and is ready to be made online to the storage enclosure 112, 224. In a preferred embodiment, pushbutton 804 is not present within drawer indicators and controls 424, and instead a user provides such an indication through GUI 120 of management computer 116.

Drawer indicators and controls 424 also include one or more indicators 808. In the preferred embodiment, an indicator 808 is provided on the front of drawer 352 to indicate a drawer 352 is safe to remove from the chassis 304. The indicator 808 is driven by a remove drawer indicator 824 signal from the chassis midplane 340. Other indicators 808 may be present within drawer midplane 396, including a drawer fault indicator, storage device 208 fault indicators, or other indicators associated with drawer 352 or drawer midplane 396.

Interconnect cable assembly 828 includes DC power 816. DC power 816 is provided by power supplies 332a, 332b and includes various grounds and DC voltages required by storage devices 208 and drawer midplane 396. In the preferred embodiment, DC voltages 816 include ground, +5 Volts DC, and +12 Volts DC. However, in other embodiments other DC voltages 816 may be present.

Interconnect cable assembly 828 also includes a drawer present 812 signal, which indicates to the chassis midplane 340 that a drawer 352 is present and interconnected to the chassis midplane 340 through the interconnect cable assembly 828. In the preferred embodiment, the drawer present 812 signal is simply a grounded signal when the drawer 352 is interconnected. In other embodiments, drawer present 812 is a serial bitstream or predetermined DC voltage that indicates the presence and possibly the status of drawer 352.

Interconnect cable assembly 828 also includes SAS data buses 220, which provide redundant bidirectional data communication between the drawer midplane 396 and each storage controller 204a, 204b. Electrical failures in any one drawer 352 or between any one drawer 352 and the chassis midplane 340 do not affect any other drawer 352. Electrical failures include a loss of DC power 816 to a drawer 352 or a shorted or disconnected signal in interconnect cable assembly 828.

Referring now to FIG. 9, a block diagram illustrating storage enclosure 112, 224 DC power distribution in accordance with embodiments of the present invention is shown. The power distribution arrangement illustrated in FIG. 9 prevents a power failure in any module from affecting any other module of the storage enclosure 112, 224. Modules include drawers 352, power supplies 332, or storage controller modules 336.

FIG. 9 illustrates a storage enclosure 112 with three drawers 352, identified as drawers 352a, 352b, and 352c. The storage enclosure 112 has two storage controllers 204a and 204b, and two power supplies 332a and 332b. Each drawer 352 stores up to a predetermined number of storage devices 208, although a given drawer 352 at times may contain no storage devices 208. The power supplies 332a, 332b each has an independent connection to external AC or DC power 336, and a single power supply 332a, 332b in some embodiments is able to power the entire storage enclosure 112, 224. Each of the modules (drawers 352a, 352b, and 352c, storage controllers 204a, 204b, or power supplies 332a, 332b) are interconnected through the chassis midplane 340, which is illustrated with a dashed line for clarity.

Each module has an associated energy storage capacitor C1-C7 as an essential part of that module. In a preferred embodiment, the energy storage capacitors C1-C7 are nominally 4000 uF. However, other capacitor C1-C7 values may be used in order to meet the timing requirement described below. The line connecting all the modules to the chassis midplane 340 could be either 5 volt DC or 12 volt DC, or any other DC voltage or combination of DC voltages. Where multiple DC voltages are provided to each of the modules by the power supplies 332a, 332b, separate power distribution circuits are provided for each DC voltage, and the circuit is identical for each separate DC voltage.

Each power supply 332a, 332b and storage controller 204a, 204b has a diode D4-D7 placed between the energy storage capacitor C4-C7 and the DC voltage. For the drawers 352a, 352b, and 352c, this diode D1-D3 is on the chassis midplane 340 while for the storage controllers 204a, 204b and power supplies 332a, 332b the diode D4-D7 is part of that module. The diodes D1-D7 isolate each energy storage capacitor C1-C7 from the DC voltage.

To explain in more detail one needs to consider how a short in one of the modules affects the common rail and the energy stored in the all the other energy storage capacitors C1-C7. For this explanation, the short can be considered to occur in one of the energy storage capacitors C1-C7 itself. The behavior is slightly different for the drawers 352a, 352b, and 352c and storage controllers 204a, 204b than for the power supplies 332a, 332b.

First, consider a short in C6 908a associated with power supply 332a. Although the voltage immediately goes to zero at C6, the voltage rail and all the remaining energy in storage capacitors C1-C5, and C7 are unaffected. C1-C5, and C7 are unaffected since they are isolated by the diode D6 904a in power supply 332a, which becomes reverse biased and does not allow energy from any of the remaining capacitors C1-C5, and C7 to flow into the short. The power supply 332a itself dumping energy into its shorted capacitor C6 908a does not need to be considered since the power supply 332a in most embodiments has protective circuits which shut it down once the short is sensed. This action of the circuit in response to a short in the power supply 332 itself, is used in all practical redundant power supply configurations.

Next consider a short in the drawer 352a, or more specifically, energy storage capacitor C1 924a. At the moment this short occurs, the common voltage rail is pulled to zero volts as a result of the short in C1 924a. Although the power supplies 332a, 332b will dump energy into this short, the diodes D2 932b and D3 932c associated with the other drawers 352b and 352c, respectively, become reverse biased and prevent the energy that is stored in their associated capacitors C2 924b and C3 924c, respectively, from flowing back onto the voltage rail and into the short. Their energy will flow instead into storage devices 208 and storage controllers 204a, 204b and allow these modules to continue to operate for a period of time until the voltage level falls below some critical threshold. Meanwhile, at the shorted capacitor C1 924a, both power supplies 332a, 332b are dumping energy (current) into the short which will cause fuse F1 928a to open. Once this happens, the voltage rail will return to its normal level and recharge the energy storage capacitors C2-C7 in the remaining elements.

In order to provide proper fault isolation, there is a critical timing parameter which must be met. The time for fuse F1 928a to open must be shorter than for the voltage levels in the capacitors C2 and C3 associated with drawers 352b and 352c, and capacitors C4 920a and C5 920b associated with controllers 204a, 204b, respectively, to reach the critical level where their circuits can no longer function. In a preferred embodiment, fuses F1-F5 use electronic circuits such as TPS24720 controllers with IRF6718 FETs (field effect transistors) instead of actual fuses to shorten this fault time to 1 millisecond or less, but the principle is the same in either case. FETs such as Renesas UPA2766T 1A devices configured as diodes instead of actual diodes D1-D7 may be used to reduce the forward voltage loss but again the action is the same as if a real diode was used. In embodiments using actual diodes, devices similar to 19TQ015 are used. In the preferred embodiment, a TPS2419 ORing FET controller is used, which makes a FET behave like a diode but has lower forward voltage loss. With an electronic fuse there is some control over the timing parameter, whereas if an actual fuse was used the trip time might be longer, such as 10 ms.

Electronic fuses may be set to retry automatically, or they may be configured to wait for a power cycle of storage enclosure 112, 224. In the preferred embodiment, a software-controlled power cycle sequence is preferred, since repeatedly running into an overcurrent trip cycle can be very damaging to electronic components.

In the preferred embodiment, a storage controller 204 separately enables independent DC power to each drawer 352 under software control. In other embodiments, a processor or other circuitry on the chassis midplane 340 separately enables independent DC power to each drawer 352 under software control. In yet other embodiments, a processor or other circuitry on the chassis midplane 340 separately enables independent DC power to each drawer 352 under manual control such as through a pushbutton on the storage enclosure 112, 224.

Referring now to FIG. 10a, a flowchart illustrating a drawer 352 installation process of the present invention is shown. Drawers 352 are inserted as part of adding a storage enclosure 112, 224 to an equipment rack, expanding the storage capacity of a storage enclosure 112, 224, or after servicing one or more components in a drawer 352. Storage devices 208 are normally individually removed or inserted in a drawer 352, as described with reference to FIG. 3j. Flow begins at block 1004.

At block 1004, power to the drawer 352 is inactivated. In one embodiment, a mechanical switch removes power from an interconnect cable assembly 828 between the storage enclosure 112 and the drawer 352. In a preferred embodiment, the user uses a GUI 120, command line interface, or other software-based mechanism to command the storage enclosure 112 to remove power from the drawer 352. Flow proceeds to block 1008.

At block 1008, the user mechanically installs the drawer 352 on drawer slides 348 of the storage enclosure 112, 224. In some embodiments, the user engages a mechanical latch on the drawer bottom 416 in order to secure the drawer 352 to drawer slides 348 of the storage enclosure 112, 224. The mechanical latch on the drawer bottom 416 engages a mechanical latch hole 350 on the drawer slides 348. Flow proceeds to block 1012.

At block 1012, the user mechanically attaches a cable management system 356, if present, to the drawer 352. The cable management system 356 protects electrical wiring between the storage enclosure 112, 224 and each drawer 352. The cable management system 356 moves with an interconnect cable assembly 828 as the drawer 352 is extended or retracted. In some embodiments, the cable management system 356 is only mechanically connected at the drawer 352 end. In other embodiments, the cable management system 356 is mechanically connected at both the drawer 352 end and the storage enclosure 112, 224 end. Flow proceeds to block 1016.

At block 1016, the user attaches the interconnect cable assembly 828 to the drawer midplane 396. This step electrically connects the drawer 352 to the storage enclosure 112, 224. Flow proceeds to block 1020.

At block 1020, a user requests the drawer 352 be brought online to the storage enclosure 112, 224. In one embodiment, the drawer 352 has a pushbutton or other control 804 that generates a signal 820 to the storage enclosure 112, 224. In a preferred embodiment, the user uses a GUI 120, command line interface, or other software-based mechanism to request the drawer 352 be brought online. Flow proceeds to block 1024.

At block 1024, the storage controller 112, 224 detects drawer presence. In a preferred embodiment, the interconnect cable assembly 828 between a drawer 352 in the storage enclosure 112, 224 includes a wire or signal 812 having a predetermined DC state when the drawer 352 is interconnected to the storage enclosure 112, 224. In one embodiment, the predetermined DC state is grounded. In a second embodiment, the predetermined DC state is a predetermined DC voltage level such as 3.3 Volts DC or 5 Volts DC. In other embodiments, the drawer 352 transmits a predetermined serial bitstream or parallel communications message 812 to the storage enclosure 112, 224. The bitstream or parallel communications message 812 identifies the presence of the drawer 352, and in some embodiments an indication of a specific identity of a drawer 352 differentiated from specific identities of other drawers 352. In yet other embodiments, optical sensing is supported within the storage enclosure 112, 224 to determine the presence of each drawer 352. Flow proceeds to block 1028.

At block 1028, the storage controller 112, 224 applies power to the drawer 352 through the interconnect cable assembly 828. The DC outputs of the power supplies 332a, 332b in the storage enclosure 112, 224 are controlled by the storage controllers 204a, 204b in order to selectively provide DC power to each drawer 352. Once power is applied to a drawer 352, all storage devices 208 in the drawer 352 are activated. Flow proceeds to block 1032.

At block 1032, the storage controller 204a, 204b brings the drawer 352 online. Bringing the drawer 352 online includes initializing drawer midplane 396 components and each storage device 208 in the drawer 352. Storage devices 208, where present, in many embodiments are built into RAID logical volumes. Once the drawer 352 is online, all storage devices 208 in the drawer 352 are able to be accessed. Flow ends at block 1032.

Referring now to FIG. 10b, a flowchart illustrating a drawer 352 removal process of the present invention is shown. Drawers 352 are removed in order to service drawer 352 components or assemblies other than storage devices 208, including the drawer midplane 396 or the interconnect cable assembly 828 interconnecting a drawer 828 with the storage enclosure 112, 224. Storage devices 208 are normally individually removed or inserted, as described with reference to FIG. 3j. Flow begins at block 1036.

At block 1036, the storage controllers 204a, 204b detect drawer 352 presence. In a preferred embodiment, the interconnect cable assembly 828 between a drawer 352 in the storage enclosure 112, 224 includes a wire or signal having a predetermined DC state 812 when the drawer 352 is interconnected to the storage enclosure 112, 224. In one embodiment, the predetermined DC state is grounded. In a second embodiment, the predetermined DC state is a predetermined DC voltage level such as 3.3 volts DC or 5 volts DC. In other embodiments, the drawer 352 transmits a predetermined serial bitstream or parallel communications message 812 to the storage enclosure 112, 224. The bitstream or parallel communications message 812 identifies the presence of the drawer 352, and in some embodiments an indication of a specific identity of a drawer 352 differentiated from specific identities of other drawers 352. In yet other embodiments, optical sensing is supported within the storage enclosure 112, 224 to determine the presence and/or absence of each drawer 352. Flow proceeds to block 1040.

At block 1040, a user requests the drawer 352 be taken off-line to the storage enclosure 112, 224. In one embodiment, the drawer 352 has a pushbutton or other control 804 that generates a signal 820 to the storage enclosure 112, 224. In a preferred embodiment, the user uses a GUI 120, command line interface, or other software-based mechanism to select the drawer 352 be taken off-line. Flow proceeds to block 1044.

At block 1044, the storage controllers 204a, 204b check for storage redundancy. Storage redundancy is important in order to prevent data loss during the act of taking a drawer 352 off-line. Storage redundancy provides data redundancy across the storage device drawers 352 of the storage enclosure 112, 224, such that if any one drawer 352 is removed or nonfunctional, data on the storage devices 208 of the removed drawer 352 may be found or re-created from other storage devices 208 in other non-removed drawers 352. Flow proceeds to decision block 1048.

At decision block 1048, the storage controllers 204a, 204b determine if the data stored in the drawer 352 to be taken off-line is redundant. If the storage controllers 204a, 204b determine that the data stored in the drawer 352 to be taken off-line is not redundant, then flow proceeds to block 1052. If the storage controllers 204a, 204b determine that the data stored in the drawer 352 to be taken off-line is redundant, then flow proceeds to block 1060.

At block 1052, the storage controllers 204a, 204b notify the user that the data in the drawer 352 to be taken off-line is not redundant. Flow proceeds to block 1056.

At block 1056, the user corrects the data redundancy deficiency of the storage enclosure 112, 224. In one embodiment, the user redistributes data according to well-known redundant array of inexpensive disks (RAID) techniques across the storage device drawers 352 in order to make the data on the drawer 352 to be taken off-line redundant. Flow proceeds to decision block 1048.

At block 1060, the storage controllers 204a, 204b remove power from the drawer 352. The DC outputs of the power supplies 332a, 332b in the storage enclosure 112, 224 are controlled by the storage controllers 204a, 204b in order to selectively provide DC power to each drawer 352. Once power is removed from a drawer 352, all storage devices 208 in the drawer 352 are inactivated. The storage controllers 204a, 204b are prepared for all storage devices 208 in the drawer 352 being inactivated, and because storage redundancy has previously been assured, the storage controllers 204a, 204b remove power from the drawer 352 without concern for data loss. Flow proceeds to block 1064.

At block 1064, the storage controllers 204a, 204b activate a drawer indicator 808 to remove the drawer 352. In a preferred embodiment, the drawer indicator 808 is included within drawer indicators and controls 424, and is an LED on the front of the drawer 352 which indicates to a user that the drawer 352 is able to be safely removed from the storage enclosure 112, 224. In another embodiment, the drawer indicator 808 is a text display on the front of the drawer 352 which instructs the user to remove the drawer 352 from the storage enclosure 112, 224. In yet another embodiment, the drawer indicator is an indicator in a management computer GUI 120 which instructs the user to remove the drawer 352 from the storage enclosure 112, 224. Flow proceeds to block 1068.

At block 1068, the user mechanically detaches the cable management system 356, if present, from the drawer 352. The cable management system 356 protects electrical wiring between the storage enclosure 112, 224 and each drawer 352. In some embodiments, the cable management system 356 is only mechanically disconnected at the drawer 352 end. In other embodiments, the cable management system 356 is mechanically disconnected at the drawer 352 end and the storage enclosure 112, 224 end. Flow proceeds to block 1072.

At block 1072, the user detaches the interconnect cable assembly 828 from the drawer midplane 396. This step electrically disconnects the drawer 352 from the storage enclosure 112, 224. Flow proceeds to block 1076.

At block 1076, the user mechanically removes the drawer 352 from drawer slides 348 of the storage enclosure 112, 224. In some embodiments, the user engages a mechanical latch on the drawer bottom 416 in order to remove the drawer 352 from the drawer slides 348 of the storage enclosure 112, 224. The mechanical latch on the drawer bottom 416 engages a mechanical latch hole 350 on the drawer slides 348. Flow ends at block 1076.

Referring now to FIG. 11*a*, a diagram illustrating a mounted storage device 368 of the present invention is shown. The mounted storage device 368 includes three components: the storage device 208 itself, a storage device carrier left side 1104, and a storage device carrier right side 1108. Each of the storage device carrier left side 1104, and right side 1108 include suitable fasteners to attach each of the storage device carrier left 1104 and right 1108 sides to the storage device 208.

The storage device carrier left side 1104 includes a left side half finger grab 1112, and the storage device carrier right side 1108 includes a right side half finger grab 1116. The left side half finger grab 1112 and the right side half finger grab 1116 together provide surfaces through which a user achieves finger purchase of a mounted storage device 368 when inserting or removing a mounted storage device 368 to/from a drawer 352. The mounted storage device 368 is removed from a drawer 352 by pinching the left side half finger grab 1112 and the right side half finger grab 1116 together in a direction of finger pressure to disengage the carrier latch 1316, and pulling the mounted storage device 368 from the drawer 352.

Referring now to FIG. 11*b*, a stack of four mounted storage devices 368 of the present invention is shown. Although four mounted storage devices 368 are illustrated in FIG. 11*b*, the present invention is not limited to four mounted storage devices 368 in a stack, and a stack may contain one or more mounted storage devices 368. Additionally, not all storage device spaces in a stack may be populated with a mounted storage device 368. For example, there may be mounted storage devices 368 in the middle two mounted storage device slots in a stack, and the top and bottom mounted storage device slots in the stack may be empty.

Referring now to FIG. 12*a*, a diagram illustrating a front view of a storage device carrier left side 1104 in accordance with embodiments of the present invention is shown. The storage device carrier left side 1104 includes a side portion 1216 and a front portion 1220. The side portion 1216 has attachment holes 1204 for securing a storage device 208 to the storage device carrier left side 1104. The attachment holes 1204 are used in conjunction with screws or other suitable fasteners. The front portion of the storage device carrier left side 1220 includes a left side half finger grab 1112, and is shaped in order to allow a user fingertip to exert horizontal force toward the center of a mounted storage device 368.

In some embodiments, the storage device carrier left side 1104 includes a stiff portion 1208 that resists deflection when a user fingertip exerts horizontal force toward the center of a mounted storage device 368. Also in some embodiments, the storage device carrier left side 1104 includes an alignment tab recess 1212. The alignment tab recess 1212 receives an alignment tab 1312 of the storage device carrier right side 1108 in order to maintain alignment between the storage device carrier left side 1104 and right side 1108 when the finger grabs 1112, 1116 are pushed together. In some embodiments, the alignment tab recess 1212 and alignment tab 1312 are not present.

Referring now to FIG. 12*b*, a diagram illustrating a rear view of the storage device carrier left side 1104 in accordance with embodiments of the present invention is shown. The rear view of the storage device carrier left side 1104 further illustrates the features described with respect to FIG. 12*a*.

Referring now to FIG. 13*a*, a diagram illustrating a front view of a storage device carrier right side 1108 in accordance with embodiments of the present invention is shown. The storage device carrier right side 1108 includes a side portion 1320 and a front portion 1324. The side portion 1320 has attachment holes 1304 for securing a storage device 208 to the storage device carrier right side 1108. The attachment holes 1304 are used in conjunction with screws or other suitable fasteners. The front portion of the storage device carrier right side 1324 includes a right side half finger grab 1116, and is shaped in order to allow a user fingertip to exert horizontal force toward the center of a mounted storage device 368.

The storage device carrier right side 1108 includes a carrier latch 1316, which is a ramped projection that engages a latching hole 436 of the drawer chassis 388 to secure the mounted storage device 368 when it is fully seated. The ramped surface toward the rear of the carrier latch 1316 allows the front portion of storage device carrier right side 1324 to deflect inwardly as the mounted storage device 368 is being seated in the drawer chassis 388.

In some embodiments, the side portion of storage device carrier right side 1320 includes a flexible portion 1308 that allows deflection when a user fingertip exerts horizontal force on the right side half finger grab 1116 toward the center of a mounted storage device 368. Also in some embodiments, the front portion of storage device carrier right side 1324 includes an alignment tab 1312. The alignment tab 1312 engages an alignment tab recess 1212 of the front portion of the storage device carrier left side 1220 in order to maintain alignment between the storage device carrier left side 1104 and right side 1108 when the finger grabs 1112, 1116 are pushed together. In some embodiments, the alignment tab recess 1212 and alignment tab 1312 are not present.

Referring now to FIG. 13*b*, a diagram illustrating a rear view of the storage device carrier right side 1108 of embodiments of the present invention is shown. The rear view of the storage device carrier right side 1108 further illustrates the features described with respect to FIG. 13*a*.

Although FIGS. 13*a* and 13*b* illustrate the carrier latch 1316, flexible portion 1308, and alignment tab 1312 on the storage device carrier right side 1108, and the stiff portion 1208 and alignment tab recess 1212 on the storage device carrier left side 1104, it should be understood by one of ordinary skill in the art that these features may be located opposite to what is shown. That is, the carrier latch 1316, flexible portion 1308, and alignment tab 1312 on the storage device carrier left side 1104, and the stiff portion 1208 and alignment tab recess 1212 on the storage device carrier right side 1108.

In a preferred embodiment, the storage device carrier left side 1104 and right side 1108 are each fabricated as a single piece from a cost effective resilient material such as ABS plastic. In other embodiments, either or both the storage device carrier left side 1104 and right side 1108 are each fabricated as multiple pieces of material. In some embodiments, different materials may be used for each piece of a storage device carrier left side 1104 and right side 1108. In other embodiments, similar or the same materials may be used for each piece of a storage device carrier left side 1104 and right side 1108.

Materials used to fabricate the storage device carrier left side 1104 and right side 1108 includes various plastics or metals such as aluminum, steel, or alloys.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A storage device carrier, comprising:
   a first member, comprising:
      a side portion; and
      a front portion, comprising a stiff portion, perpendicularly coupled to an inside surface of a front end of the first member side portion, the front portion comprising a first portion of a finger grab;
   a second member, comprising:
      a side portion comprising a latching feature, wherein the latching feature is on an outside surface of the second member side portion; and
      a front portion, perpendicularly coupled to an inside surface of a front end of the second member side portion, comprising a second portion of the finger grab,
   wherein the stiff portion resists deflection of the first portion of the finger grab relative to the second portion of the finger grab when user fingertips exert inward horizontal force to the first and second portions of the finger grab.

2. The storage device carrier of claim 1, a mounted storage device comprising the first and second members attached to a storage device, wherein the mounted storage device second portion of the finger grab is movable relative to the first portion of the finger grab when the first and second portions of the finger grab are pushed together.

3. The storage device carrier of claim 2, wherein one of the first member and second member front portions comprises a projecting tab, wherein the other of the one of the first member and second member front portions comprises a recess for receiving the projecting tab.

4. The storage device carrier of claim 3, a mounted storage device comprising the first and second members attached to a storage device, the first portion of the finger grab is adjacent to the second portion of the finger grab, and the projecting tab is at least partially in the recess for receiving the projecting tab.

5. The storage device carrier of claim 4, wherein the mounted storage device is removed from a drawer by pushing the first and second portions of the finger grab together and pulling the mounted storage device from the drawer.

6. The storage device carrier of claim 4, wherein the mounted storage device is inserted into the drawer by pushing the first and second portions of the finger grab together and pushing the mounted storage device into the drawer until the latching feature engages the drawer.

7. The storage device carrier of claim 2, each of the first and second member side portions comprising at least one hole for attaching the first and second members to a storage device, wherein the storage device is mounted in the storage device carrier upside-down.

8. The storage device carrier of claim 2, the latching feature comprising a hole, wherein the hole engages an inward projection of a drawer when the mounted storage device is pushed into the drawer.

9. The storage device carrier of claim 2, the latching feature comprising an outward projection, wherein the outward projection engages a hole in a side surface of a drawer when the mounted storage device is pushed into the drawer.

10. The storage device carrier of claim 2, wherein the first and second members are each a single piece of ABS plastic.

11. A storage system, comprising:
   a plurality of front-mounted drawers, each of the plurality of front-mounted drawers comprising:
      one or more mounted storage devices, each of the one or more mounted storage devices comprising:
         a storage device;
         a first member, coupled to a first side of the storage device, comprising:
            a side portion; and
            a front portion, comprising a stiff portion, perpendicularly coupled to an inside surface of a front end of the first member side portion, the front portion comprising a first portion of a finger grab; and
         a second member, coupled to a second side of the storage device opposite the first side of the storage device, comprising:
            a side portion comprising a latching feature, wherein the latching feature is on an outside surface of the second member side portion; and
            a front portion, perpendicularly coupled to an inside surface of a front end of the second member side portion, comprising a second portion of the finger grab,
         wherein the stiff portion resists deflection of the first portion of the finger grab relative to the second portion of the finger grab when user fingertips exert inward horizontal force to the first and second portions of the finger grab.

12. The storage system of claim 11, wherein the mounted storage device second portion of the finger grab is movable relative to the first portion of the finger grab when the first and second portions of the finger grab are pushed together.

13. The storage system of claim 12, wherein one of the first member and second member front portions comprises a projecting tab, wherein the other of the one of the first member and second member front portions comprises a recess for receiving the projecting tab.

14. The storage system of claim 13, wherein the mounted storage device is removed from a drawer by pushing the first and second portions of the finger grab together and pulling the mounted storage device from the drawer.

15. The storage system of claim 13, wherein the mounted storage device is inserted into the drawer by pushing the first and second portions of the finger grab together and pushing the mounted storage device into the drawer until the latching feature engages the drawer.

16. The storage system of claim 11, each of the first and second member side portions comprising at least one hole for attaching the first and second members to a storage device, wherein the storage device is mounted in the storage device carrier upside-down.

17. The storage system of claim 11, the latching feature comprising a hole, wherein the hole engages an inward projection of a side surface of a drawer when the storage device carrier is attached to a storage device and pushed into the drawer.

18. The storage system of claim 11, the latching feature comprising an outward projection, wherein the outward projection engages a hole in a side surface of a drawer when the storage device carrier is attached to a storage device and pushed into the drawer.

19. The storage system of claim 11, wherein the first and second members are each a single piece of ABS plastic.

20. A method for removing a mounted storage device from a drawer of a storage enclosure, the method comprising:
- pushing a second portion of a finger grab of the mounted storage device horizontally toward a first portion of a finger grab of the mounted storage device, the second portion of the finger grab is on a front portion of a second member and the first portion of the finger grab is on a front portion of a first member, wherein the front portion of the first member is perpendicularly coupled to an inside surface of a front end of a side portion of the first member, wherein the side portion of the first member is attached to a first side of the storage device; wherein the front portion of the second member is perpendicularly coupled to an inside surface of a front end of a side portion of the second member, wherein the side portion of the second member is attached to a second side of the storage device opposite the first side of the storage device;
- pulling the mounted storage device from the drawer, the mounted storage device comprising the storage device fastened to the first member and the second member,
- wherein pushing the second portion of the finger grab of the mounted storage device horizontally toward the first portion of the finger grab releases a latching feature in the side portion of the second member from contact with a corresponding feature in the drawer, wherein the first portion of the finger grab resists deflection relative to the second portion of the finger grab when pushing the second portion of the finger grab of the mounted storage device horizontally toward the first portion of the finger grab.

* * * * *